(12) United States Patent
Jeon et al.

(10) Patent No.: US 12,462,746 B2
(45) Date of Patent: Nov. 4, 2025

(54) DISPLAY PANEL

(71) Applicant: Samsung Display Co., LTD., Yongin-si (KR)

(72) Inventors: Yu-Jin Jeon, Yongin-si (KR); Wonse Lee, Yongin-si (KR); Nuree Um, Yongin-si (KR); Donghyeon Jang, Yongin-si (KR); Jaewon Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 17 days.

(21) Appl. No.: 18/211,389

(22) Filed: Jun. 19, 2023

(65) Prior Publication Data
US 2024/0185781 A1 Jun. 6, 2024

(30) Foreign Application Priority Data

Oct. 21, 2022 (KR) .................. 10-2022-0136863

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0842* (2013.01); *G09G 2310/0297* (2013.01); *G09G 2320/045* (2013.01)

(58) Field of Classification Search
CPC ......... G09G 3/3233; G09G 2300/0842; G09G 2310/0297; G09G 2320/045; H10K 59/131
See application file for complete search history.

(56) References Cited

U.S. PATENT DOCUMENTS

| | | | | |
|---|---|---|---|---|
| 8,350,792 | B2* | 1/2013 | Igeta | G02F 1/136286 345/55 |
| 11,271,068 | B2* | 3/2022 | Kim | H10K 50/844 |
| 2005/0258771 | A1* | 11/2005 | Kang | G09G 3/3225 315/169.1 |
| 2008/0225216 | A1* | 9/2008 | Shimodaira | G02F 1/1362 349/143 |

(Continued)

FOREIGN PATENT DOCUMENTS

| KR | 10-0570995 B1 | 4/2006 |
|---|---|---|
| KR | 10-2020-0078806 A | 7/2020 |

*Primary Examiner* — Amy Onyekaba
(74) *Attorney, Agent, or Firm* — CANTOR COLBURN LLP

(57) ABSTRACT

A display panel includes a plurality of pixels disposed in a display area, where the display area includes a round-type edge and a flat-type edge extending from the round-type edge, a first constant voltage transfer electrode extending in a first direction and disposed in a peripheral area adjacent to the display area, a first constant voltage transfer line electrically connected to the first constant voltage transfer electrode in the peripheral area, where the first constant voltage transfer line extends from the first constant voltage transfer electrode to the display area via the flat-type edge, and a second constant voltage transfer line electrically connected to the first constant voltage transfer electrode in the peripheral area, where the second constant voltage transfer line extends from the first constant voltage transfer electrode to the display area via the round-type edge.

19 Claims, 27 Drawing Sheets

(56) References Cited

U.S. PATENT DOCUMENTS

| | | | |
|---|---|---|---|
| 2012/0200611 A1* | 8/2012 | Matsui | G09G 3/3233 345/77 |
| 2016/0217740 A1* | 7/2016 | Lee | G09G 3/3258 |
| 2017/0039938 A1* | 2/2017 | Tokuda | G09G 3/3233 |
| 2017/0068136 A1* | 3/2017 | Byeon | G02F 1/134363 |
| 2017/0069285 A1* | 3/2017 | Kwak | G02F 1/133345 |
| 2017/0288002 A1* | 10/2017 | Kim | H10K 59/121 |
| 2017/0294502 A1* | 10/2017 | Ka | H10K 59/123 |
| 2019/0067407 A1* | 2/2019 | Yu | H10K 59/87 |
| 2019/0140036 A1* | 5/2019 | Hyeon | H10K 77/111 |
| 2019/0245020 A1* | 8/2019 | Choi | H01L 21/28 |
| 2019/0259345 A1* | 8/2019 | Hosoyachi | G02F 1/133514 |
| 2020/0286972 A1* | 9/2020 | Seo | H10K 77/10 |
| 2020/0303421 A1* | 9/2020 | Cho | H01L 29/7869 |
| 2020/0411625 A1* | 12/2020 | Seo | G02F 1/13452 |
| 2021/0241698 A1* | 8/2021 | Kim | G09G 3/3233 |
| 2021/0359055 A1* | 11/2021 | Lee | H10K 59/1213 |
| 2022/0068218 A1* | 3/2022 | Kwak | G09G 3/3275 |
| 2022/0208124 A1* | 6/2022 | Choi | H10K 59/40 |
| 2023/0320149 A1* | 10/2023 | Katsui | G09G 3/3233 345/212 |

* cited by examiner

DISPLAY PANEL

This application claims priority to Korean Patent Application No. 10-2022-0136863, filed on Oct. 21, 2022, and all the benefits accruing therefrom under 35 U.S.C. § 119, the content of which in its entirety is herein incorporated by reference.

BACKGROUND

1. Field

Embodiments provide generally to a display panel.

2. Description of the Related Art

A display device may include a display area including a round-type edge. Such a display device may include a display panel including a plurality of pixels generally disposed in a display area including the round-type edge.

SUMMARY

In a display device including a display panel including a plurality of pixels generally disposed in a display area including a round-type edge, luminance drop of pixels among the plurality of pixels disposed adjacent to the round-type edge may occur. When the luminance drop occurs, display quality of the display device may be reduced.

Embodiments provide a display panel having improved display quality.

A display panel according to an embodiment of the invention includes a plurality of pixels disposed in a display area, where the display area includes a round-type edge and a flat-type edge extending from the round-type edge, a first constant voltage transfer electrode extending in a first direction and disposed in a peripheral area adjacent to the display area, a first constant voltage transfer line electrically connected to the first constant voltage transfer electrode in the peripheral area, where the first constant voltage transfer line extends from the first constant voltage transfer electrode to the display area via the flat-type edge, and a second constant voltage transfer line electrically connected to the first constant voltage transfer electrode in the peripheral area, where the second constant voltage transfer line extends from the first constant voltage transfer electrode to the display area via the round-type edge.

In an embodiment, the display device may further include a horizontal transfer line electrically connected to each of the first constant voltage transfer line and the second constant voltage transfer line in the display area.

In an embodiment, each of the first constant voltage transfer line, the second constant voltage transfer line, and the horizontal transfer line may be provided in plural, and a plurality of horizontal transfer lines may cross a plurality of first constant voltage transfer lines and a plurality of second constant voltage transfer lines to form a mesh shape in a plan view.

In an embodiment, each of the first constant voltage transfer line and the second constant voltage transfer line may be integrally formed with the first constant voltage transfer electrode as a single unitary and indivisible part, and the first constant voltage transfer line and the second constant voltage transfer line may be defined as lines branching from and extending from the first constant voltage transfer electrode.

In an embodiment, each of the first constant voltage transfer line and the second constant voltage transfer line may extend in a second direction crossing the first direction in the display area.

In an embodiment, the second constant voltage transfer line may include a first portion electrically connected to the first constant voltage transfer electrode in the peripheral area, and extending in a second direction crossing the first direction, a second portion extending from the first portion in a direction crossing each of the first direction and second direction, and a third portion extending from the second portion to the display area via the round-type edge.

In an embodiment, the first constant voltage transfer line may extend in the second direction in the peripheral area.

In an embodiment, the display panel may further include a demuxing unit disposed in the display area and which demuxes a data signal, where the demuxing unit may include a first demultiplexer unit and a second demultiplexer unit disposed adjacent to the first demultiplexer unit, a first data line electrically connected to the first demultiplexer unit in the peripheral area, and extending to the display area via the flat-type edge, and a second data line electrically connected to the second demultiplexer unit in the peripheral area, and extending to the display area via the round-type edge.

In an embodiment, the first data line may include a first bridge line electrically connected to the first demultiplexer unit, and overlapping the first constant voltage transfer electrode in a plan view, where the first bridge line may be disposed in a different layer from a layer in which the first constant voltage transfer electrode is disposed, and a first data transfer line electrically connected to the first bridge line, and extending to the display area via the flat-type edge.

In an embodiment, the second data line may include a second bridge line electrically connected to the second demultiplexer unit, and overlapping the first constant voltage transfer electrode in the plan view, where the second bridge line may be disposed in a different layer from the layer in which the first constant voltage transfer electrode is disposed, and a second data transfer line electrically connected to the second bridge line, and extending to the display area via the round-type edge.

In an embodiment, the first data transfer line, the second data transfer line, the first constant voltage transfer line, and the second constant voltage transfer line may be disposed in a same layer as each other.

In an embodiment, each of the second data line and the second constant voltage transfer line may be provided in plural, and a number of a plurality of second data lines is the same as a number of a plurality of second constant voltage transfer lines.

In an embodiment, the second data lines and the second constant voltage transfer lines may be alternately arranged in the peripheral area.

In an embodiment, a planar area of the first demultiplexer unit may be greater than a planar area of the second demultiplexer unit.

In an embodiment, a width of the first demultiplexer unit in the first direction may be greater than a width of the second demultiplexer unit in the first direction.

In an embodiment, the display panel may further include a second constant voltage transfer electrode disposed to space apart from the first constant voltage transfer electrode in a second direction crossing the first direction, and electrically connected to a pad electrode unit, where the first demultiplexer unit and the second demultiplexer unit are disposed between the first constant voltage transfer electrode and the second constant voltage transfer electrode, and a constant voltage bridge electrode electrically connecting the first constant voltage transfer electrode and the second constant voltage transfer electrode to each other.

In an embodiment, each of the first demultiplexer unit and the constant voltage bridge electrode may be provided in plural, and one of a plurality of constant voltage bridge electrodes is disposed between two adjacent first demultiplexer units among a plurality of first demultiplexer units in a plan view.

In an embodiment, the display panel may further include a cover bridge electrode electrically connecting the first constant voltage transfer electrode and the second constant voltage transfer electrode to each other, and overlapping at least a portion of the second demultiplexer unit in a plan view.

In an embodiment, the cover bridge electrode may be electrically insulated from the second demultiplexer unit.

A display panel according to an embodiment of the invention includes a plurality of pixels disposed in a display area, where the display area includes a round-type edge and a flat-type edge extending from the round-type edge, a first constant voltage transfer electrode extending in a first direction and disposed in a peripheral area adjacent to the display area, a first constant voltage transfer line electrically connected to the first constant voltage transfer electrode in the peripheral area, where the first constant voltage transfer line extends from the first constant voltage transfer electrode to the display area via the flat-type edge, a second constant voltage transfer line electrically connected to the first constant voltage transfer electrode in the peripheral area, where the second constant voltage transfer line extends from the first constant voltage transfer electrode to the display area via the round-type edge, a vertical transfer line disposed in the display area adjacent to the round-type edge, where the vertical transfer line is disposed adjacent to the second constant voltage transfer line, and a horizontal transfer line electrically connected to each of the first constant voltage transfer line, the second constant voltage transfer line, and the vertical transfer line in the display area.

In an embodiment, each of the first constant voltage transfer line, the second constant voltage transfer line, the vertical transfer line, and the horizontal transfer line may be provided in plural, and a plurality of horizontal transfer lines may cross a plurality of first constant voltage transfer lines, a plurality of second constant voltage transfer lines, and a plurality of vertical transfer lines to form a mesh shape in a plan view.

In an embodiment, each of the first constant voltage transfer line and the second constant voltage transfer line may be integrally formed with the first constant voltage transfer electrode as a single unitary and indivisible part, where the first constant voltage transfer line and the second constant voltage transfer line are defined as lines branching from and extending from the first constant voltage transfer electrode.

In an embodiment, the vertical transfer line may be spaced apart from the first constant voltage transfer electrode, and the first constant voltage transfer line, the second constant voltage transfer line, and the vertical transfer line may be disposed in a same layer as each other.

In an embodiment, each of the first constant voltage transfer line, the second constant voltage transfer lien, and the vertical transfer line may extend in a second direction crossing the first direction in the display area.

In an embodiment, the display panel may further include a demuxing unit disposed in the display area and which demuxes a data signal, where the demuxing unit includes a first demultiplexer unit and a second demultiplexer unit disposed adjacent to the first demultiplexer unit, a first data line electrically connected to the first demultiplexer unit in the peripheral area, and extending to the display area via the flat-type edge, and a second data line electrically connected to the second demultiplexer unit in the peripheral area, and extending to the display area via the round-type edge.

In an embodiment, each of the second data line, the second constant voltage transfer line, and the vertical transfer line may be provided in plural, and a number of a plurality of second data lines may be the same as a sum of a number of a plurality of second constant voltage transfer lines and a plurality of number of the vertical transfer lines.

The display panel according to an embodiment may include a plurality of pixels disposed in a display area, where the display area includes a round-type edge and a flat-type edge extending from the round-type edge, and a second constant voltage transfer line electrically connected to a first constant voltage transfer electrode in a peripheral area, where the second constant voltage transfer line extends from the first constant voltage transfer electrode to the display area via the round-type edge. In such an embodiment, the pixels disposed in the display area adjacent to the round-type edge may receive sufficient amount of a constant voltage signal through the second constant voltage transfer line. Accordingly, luminance drop in the display area adjacent to the round-type edge may not occur.

The display panel according to an embodiment may include a plurality of pixels disposed in a display area, where the display area includes a round-type edge and a flat-type edge extending from the round-type edge, a second constant voltage transfer line electrically connected to a first constant voltage transfer electrode in a peripheral area, where the second constant voltage transfer line extends from the first constant voltage transfer electrode to the display area via the round-type edge, a vertical transfer line disposed in the display area adjacent to the round-type edge, where the vertical transfer line is disposed adjacent to the second constant voltage transfer line, and a horizontal transfer line electrically connected to each of the first constant voltage transfer line, the second constant voltage transfer line, and the vertical transfer line in the display area. In such an embodiment, the pixels disposed in the display area adjacent to the round-type edge may receive sufficient amount of a constant voltage signal through the second constant voltage transfer line or through the vertical transfer line. Accordingly, luminance drop in the display area adjacent to the round-type edge may not occur.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
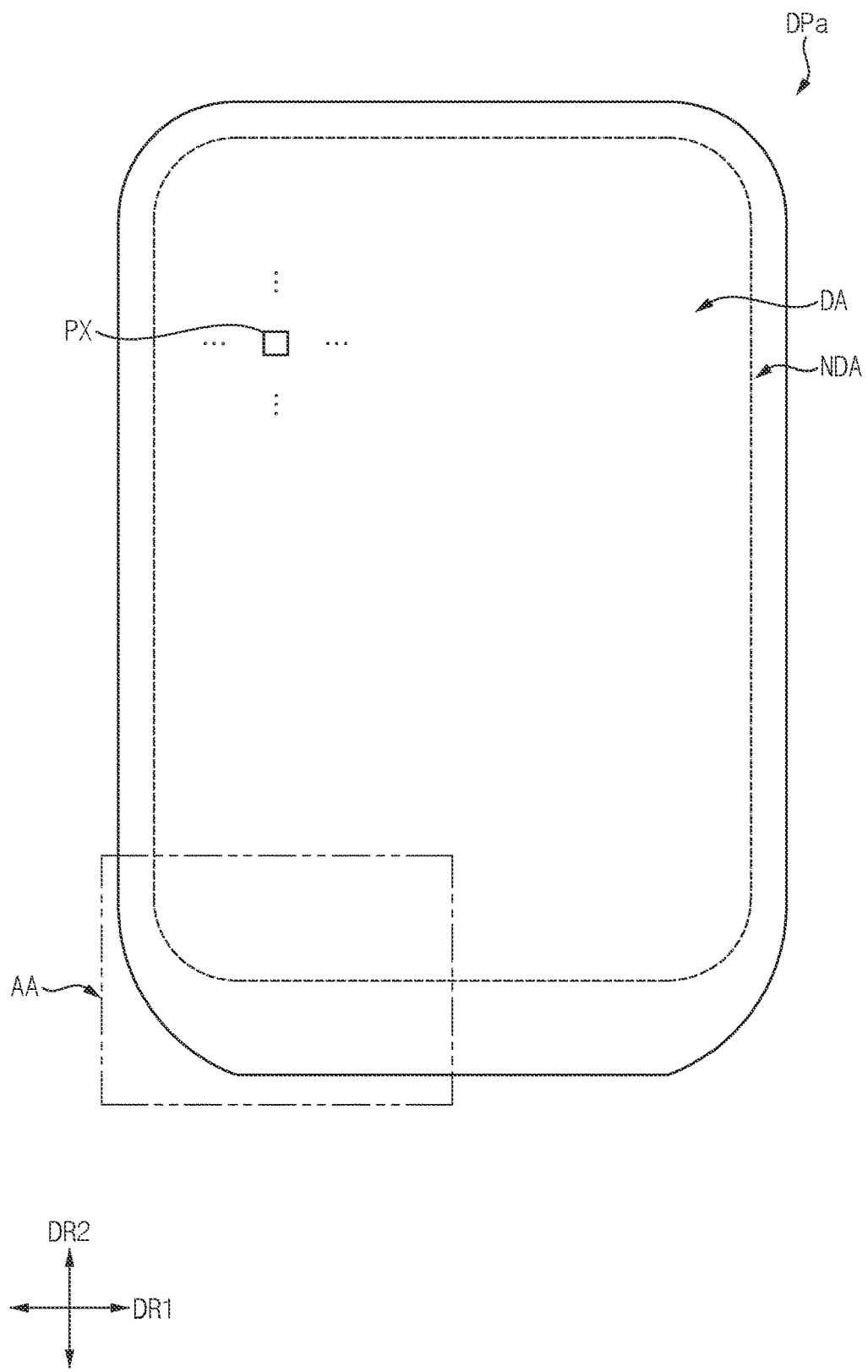
FIG. 1 is a plan view illustrating a display panel according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings. The same or like reference numerals are used for the same or like components in the drawings, and any repetitive detailed descriptions of the same or like components will be omitted.

FIG. 1 is a plan view illustrating a display panel according to an embodiment.

Referring to FIG. 1, a display panel DPa according to an embodiment may include a display area DA and a peripheral area NDA.

A pixel PX may be disposed in the display area DA. The pixel PX may be defined as a minimum unit from which light is emitted. In an embodiment, the pixel PX may be provided in plural in the display area DA, and the pixels PX may be generally disposed in the display area DA. Accordingly, an image generated by combining light emitted from each of the pixels PX may be displayed in the display area DA.

The peripheral area NDA may be disposed adjacent to at least one side of the display area DA. In an embodiment, for example, as shown in FIG. 1, the peripheral area NDA may surround the display area DA. Lines, electrodes, and/or driving circuits for transmitting (or generating) an electric signal for driving the pixel PX may be disposed in the peripheral area NDA.

The display area DA may include a round-type edge. In an embodiment, for example, as shown in FIG. 1, the display area DA may have a rectangular planar shape, and four corners of the rectangular planar shape may have curved shape, but the planar shape of the display area DA is not limited thereto. In an embodiment, for example, the display area DA may have a n-gonal planar shape (n is 3 or more than 4), and corners of the n-gonal planar shape may have curved shape.

FIG. 2, FIG. 3, FIG. 4, and FIG. 5 are enlarged plan views of an area AA of FIG. 1.

Figure 2:
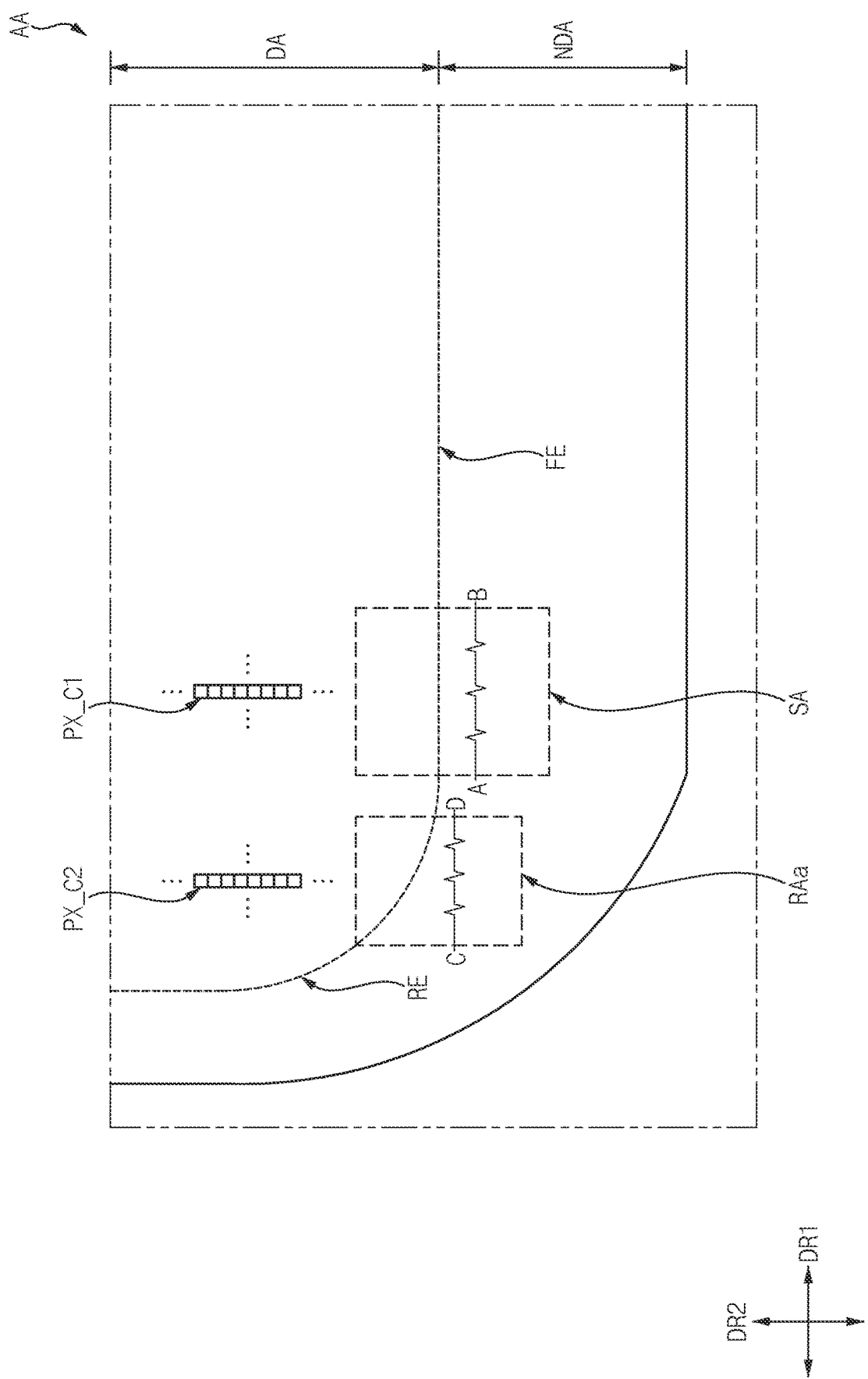
FIG. 2, FIG. 3, FIG. 4, and FIG. 5 are enlarged plan views of an area AA of FIG. 1.

Referring to FIG. 2, in an area AA of FIG. 1, in an embodiment, the display area DA may include a round-type edge RE and a flat-type edge FE extending from the round-type edge RE.

In such an embodiment, a portion of the display area DA adjacent to the round-type edge RE and a portion of the peripheral area NDA adjacent to the round-type edge RE may be referred to as a round area RAa, and a portion of the display area DA adjacent to the flat-type edge FE and a portion of the peripheral area NDA adjacent to the flat-type edge FE may be referred to as a flat area SA.

The pixels PX may be generally disposed in the display area DA. In an embodiment, for example, the pixels PX may be disposed along a first direction DR1 and a second direction DR2 crossing the first direction DR2 to form a matrix shape or in a matrix form. In such an embodiment, pixels PX arranged along the second direction DR2 in the display area DA adjacent to the flat-type edge FE may be defined as a first pixel column PX_C1, and pixels PX arranged along the second direction DR2 in the display area DA adjacent to the round-type edge RE may be defined as a second pixel column PX_C2.

Figure 3:
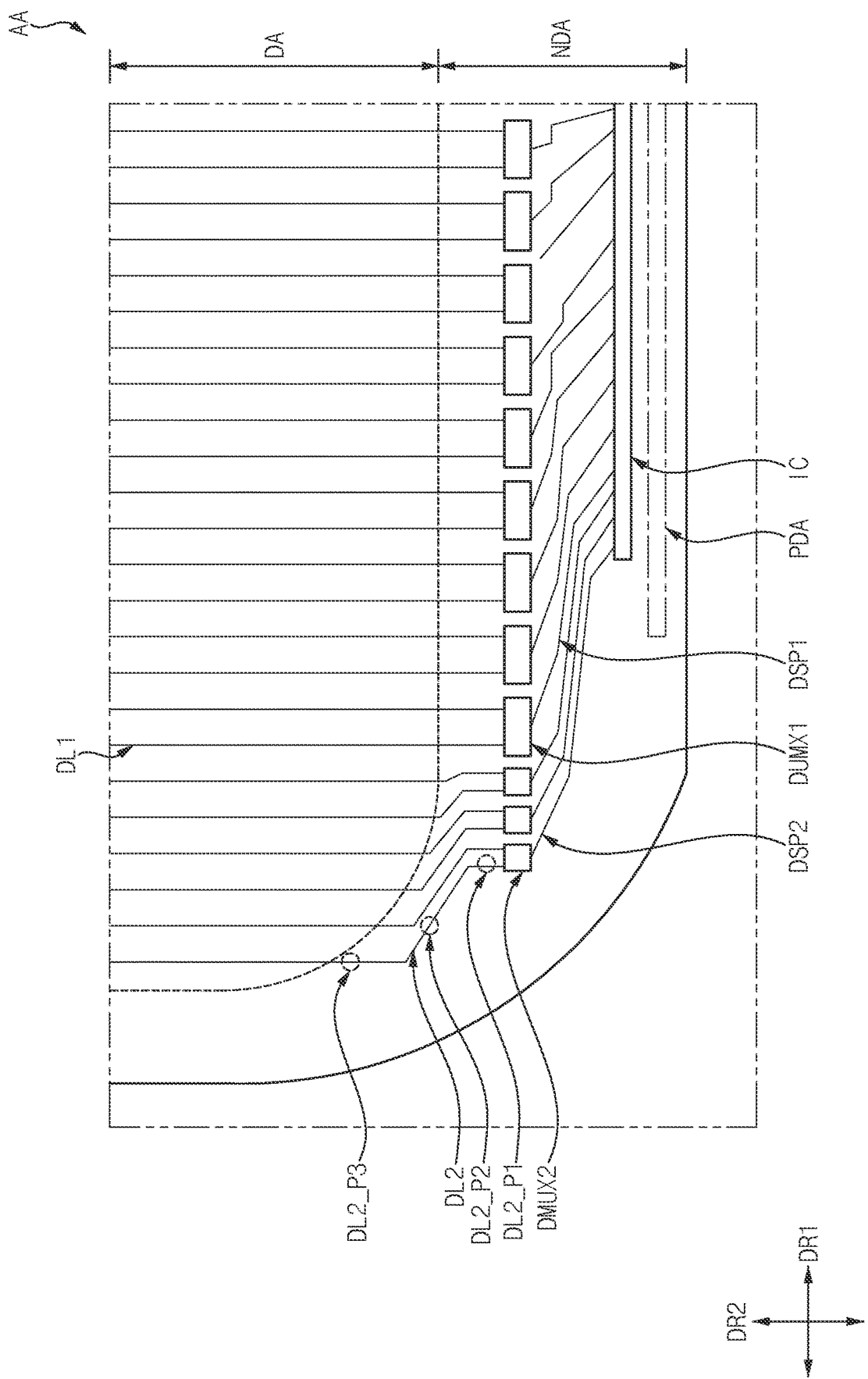

Referring to FIG. 2 and FIG. 3, various components for providing a data signal (refer to DATA of FIG. 6) to the pixel PX disposed in the display area DA may be disposed in the peripheral area NDA. in an embodiment, a first demultiplexer unit DMUX1, a second demultiplexer unit DMUX2, and a driving chip IC may be disposed in the peripheral area NDA.

The driving chip IC may extend in the first direction DR1. The driving chip IC may be electrically connected to pad electrodes disposed in a pad area PDA in the peripheral area NDA. In an embodiment, the pad electrodes may be electrically connected to a flexible printed circuit (not shown), etc. and may receive the data signal. The driving chip IC may receive the data signal from the pad electrodes, or may generate the data signal.

Each of the first demultiplexer unit DMUX1 and the second demultiplexer unit DMUX2 may be disposed to space apart from the driving chip IC in the second direction DR2. In addition, the first demultiplexer unit DMUX1 and the second demultiplexer unit DMUX2 may be arranged along the first direction DR1.

Each of the first demultiplexer unit DMUX1 and the second demultiplexer unit DMUX2 may be electrically connected to the driving chip IC. In an embodiment, for example, the first demultiplexer unit DMUX1 may be electrically connected to the driving chip IC through a first data spider line DSP1, and the second demultiplexer unit DMUX2 may be electrically connected to the driving chip IC through a second data spider line DSP2.

Each of the first demultiplexer unit DMUX1 and the second demultiplexer unit DMUX2 may receive the data signal from the driving chip IC. In addition, each of the first demultiplexer unit DMUX1 and the second demultiplexer unit DMUX2 may serve to demux the data signal. In such an embodiment, the first demultiplexer unit DMUX1 and the second demultiplexer unit DMUX2 may be referred to as a demuxing unit or a data switching unit.

Each of the first demultiplexer unit DMUX1 and the second demultiplexer unit DMUX2 may provide the data signal to the pixel PX disposed in the display area DA by demuxing (or demultiplexing) the data signal. In an embodiment, the first demultiplexer unit DMUX1 and the second demultiplexer unit DMUX2 may provide the data signal to the pixel PX through a first data line DL1 and a second data line DL2.

The first data line DL1 may be defined as a line electrically connected to the first demultiplexer unit DMUX1 in the peripheral area NDA and extending from the peripheral area NDA to the display area DA via the flat-type edge FE. In an embodiment, as shown in FIG. 3, the first data line DL1 may extend in the second direction DR2 in the peripheral area NDA and the display area DA.

The second data line DL2 may be defined as a line electrically connected to the second demultiplexer unit DMUX2 in the peripheral area NDA and extending from the peripheral area NDA to the display area DA via the round-type edge RE.

In an embodiment, the second data line DL2 may include a first portion DL2_P1, a second portion DL2_P2, and a third portion DL2_P3. The first portion DL2_P1 of the second data line DL2 may be electrically connected to the second demultiplexer unit DMUX2 in the peripheral area NDA and extending in the second direction DR2. The second portion DL2_P2 of the second data line DL2 may extend from the first portion DL2_P1 of the second data line DL2 in a direction crossing the first and second directions DR1 and DR2 in the peripheral area NDA. The third portion DL2_P3 of the second data line DL2 may extend from the second portion DL2_P2 of the second data line DL2 to the display area DA via the round-type edge RE. The third portion DL2_Pe may extend in the second direction DR2 form the second portion DL2_P2.

The first demultiplexer unit DMUX1 may provide the data signal to the pixels PX included in the first pixel column PX_C1 through the first data line DL1. The second demultiplexer unit DMUX2 may provide the data signal to the pixels PX included in the second pixel column PX_C2 through the second data line DL2.

In an embodiment, each of the first pixel column PX_C1, the second pixel column PX_C2, the first data line DL1, and the second data line DL2 may be provided in plural. In an embodiment, the first pixel columns PX_C1 may correspond to the first data lines DL1 in one-to-one correspondence, and the second pixel columns PX_C2 may be correspond to the second data lines DL2 in one-to-one correspondence. In such an embodiment, the pixels PX included in one of the first pixel columns PX_C1 may share (or be commonly connected to) one of the first data lines DL1. In addition, the pixels PX included in one of the second pixel columns PX_C2 may share one of the second data lines DL2.

Figure 4:
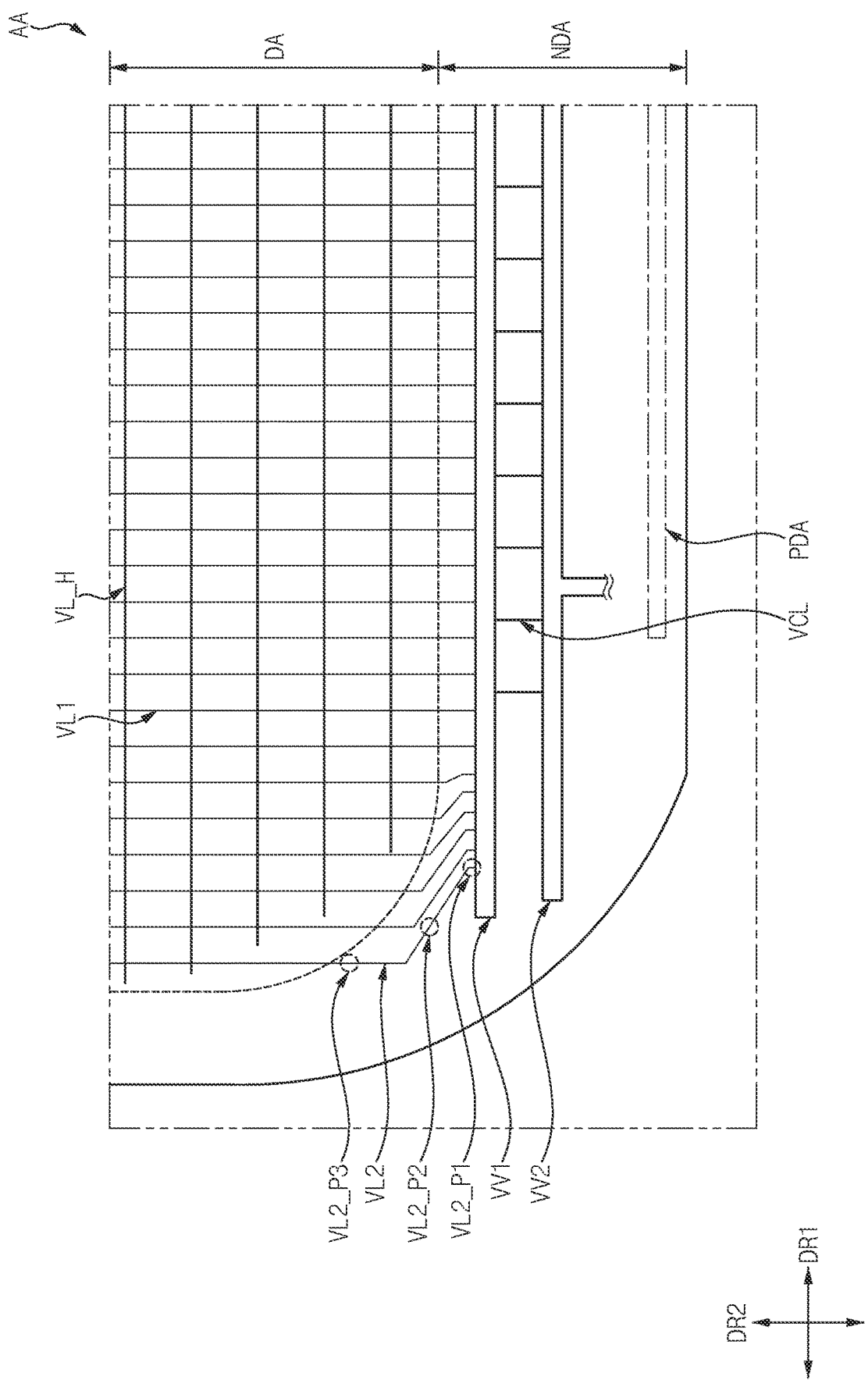

Referring to FIG. 2 and FIG. 4, various components for providing a constant voltage signal (refer to ELVDD of FIG. 6) to the pixel PX disposed in the display area DA may be disposed in the peripheral area NDA. In an embodiment, a first constant voltage transfer electrode VV1 and a second constant voltage transfer electrode VV2 may be disposed in the peripheral area NDA.

The constant voltage signal may be a signal having a relatively constant level of voltage (or current). In such an embodiment, the data signal may be a clock (or pulse) signal having various (or variable) levels of voltage (or current).

The second constant voltage transfer electrode VV2 may extend in the first direction DR1. The second constant voltage transfer electrode VV2 may be electrically connected to at least one of pad electrodes disposed in the pad area PDA. In an embodiment, the pad electrode electrically connected to the second constant voltage transfer electrode VV2 may be electrically connected to a flexible circuit film (not shown), etc. and may receive the constant voltage signal.

The first constant voltage transfer electrode VV1 may extend in the first direction DR1. The first constant voltage transfer electrode VV1 may be spaced apart from the second constant voltage transfer electrode VV2 in the second direction DR2. In an embodiment, the first constant voltage transfer electrode VV1 may be disposed to closer to the display area DA than the second constant voltage transfer electrode VV2 is.

A constant voltage bridge electrode VCL may electrically connect the first constant voltage transfer electrode VV1 and the second constant voltage transfer electrode VV2 to each other. The constant voltage bridge electrode VCL may be an electrode extending in the second direction DR2 between the first constant voltage transfer electrode VV1 and the second constant voltage transfer electrode VV2 and electrically contacting each of the first constant voltage transfer electrode VV1 and the second constant voltage transfer electrode VV2.

In an embodiment, the first constant voltage transfer electrode VV1 may receive the constant voltage signal from the second constant voltage transfer electrode VV2. In such an embodiment, the first constant voltage transfer electrode VV1 may provide the constant voltage signal to the pixel PX disposed in the display area DA. In an embodiment, the first constant voltage transfer electrode VV1 may provide the constant voltage signal to the pixel PX through a first constant voltage transfer line VL1 and a second constant voltage transfer line VL2.

The first constant voltage transfer line VL1 may be defined as a line electrically connected to the first constant voltage electrode VV1 in the peripheral area NDA and extending from the peripheral area NDA to the display area DA via the flat-type edge FE. In an embodiment, as shown in FIG. 4, the first constant voltage transfer line VL1 may extend in the second direction DR2 in the peripheral area NDA and the display area DA.

The second constant voltage transfer line VL2 may be defined as a line electrically connected to the first constant voltage electrode VV1 in the peripheral area NDA and extending from the peripheral area NDA to the display area DA via the round-type edge RE.

In an embodiment, the second constant voltage transfer line VL2 may include a first portion VL2_P1, a second portion VL2_P2, and a third portion VL2_P3. The first portion VL2_P1 of the second voltage transfer line VL2 may be electrically connected to the first constant voltage transfer electrode VV1 in the peripheral area NDA and may extend in the second direction DR2. The second portion VL2_P2 of the second constant voltage transfer line VL2 may extend from the first portion VL2_P1 of the second constant voltage transfer line VL2 in a direction crossing each of the first direction DR1 and the second direction DR2 in the peripheral area NDA. The third portion VL2_P3 of the second constant voltage transfer line VL2 may extend from the second portion VL2_P2 of the second constant voltage transfer line VL2 to the display area DA via the round-type edge RE. The third portion VL2_P3 may extend in the second direction DR2 from the second portion VL2_P2.

The first constant voltage transfer electrode VV1 may provide the constant voltage signal to the pixels PX included in the first pixel column PX_C1 through the first constant voltage transfer line VL1. In addition, the first constant voltage transfer electrode VV1 may provide the constant voltage signal to the pixels PX included in the second pixel column PX_C2 through the second constant voltage transfer line VL2.

In an embodiment, each of the first pixel column PX_C1, the second pixel column PX_C2, the first constant voltage transfer line VL1, and the second constant voltage transfer line VL2 may be provided in plural. In an embodiment, the first pixel columns PX_C1 may be correspond to the first constant voltage transfer lines VL1 in one-to-one correspondence, and the second pixel columns PX_C2 may be correspond to the second constant voltage transfer lines VL2 in one-to-one correspondence. In such an embodiment, the pixels PX included in one of the first pixel columns PX_C1 may share one of the first constant voltage transfer line VL1, and the pixels PX included in one of the second pixel columns PX_C2 may share one of the second constant voltage transfer line VL2.

In an embodiment, a horizontal transfer line VL_H may be further disposed in the display area DA. The horizontal transfer line VL_H may be electrically connected to each of the first constant voltage transfer line VL1 and the second constant voltage transfer line VL2.

The horizontal transfer line VL_H may extend in the first direction DR1 in the display area DA. In an embodiment, the pixels PX arranged in the first direction DR1 in the display area DA may share one horizontal transfer line VL_H.

Each of the horizontal transfer line VL_H, the first constant voltage transfer line VL1, and the second constant voltage transfer line VL2 may be provided in plural. In an embodiment, as shown in FIG. 4, the horizontal transfer lines VL_H may cross the first constant voltage transfer lines VL1 and the second constant voltage transfer lines VL2 to form a mesh shape.

Figure 5:
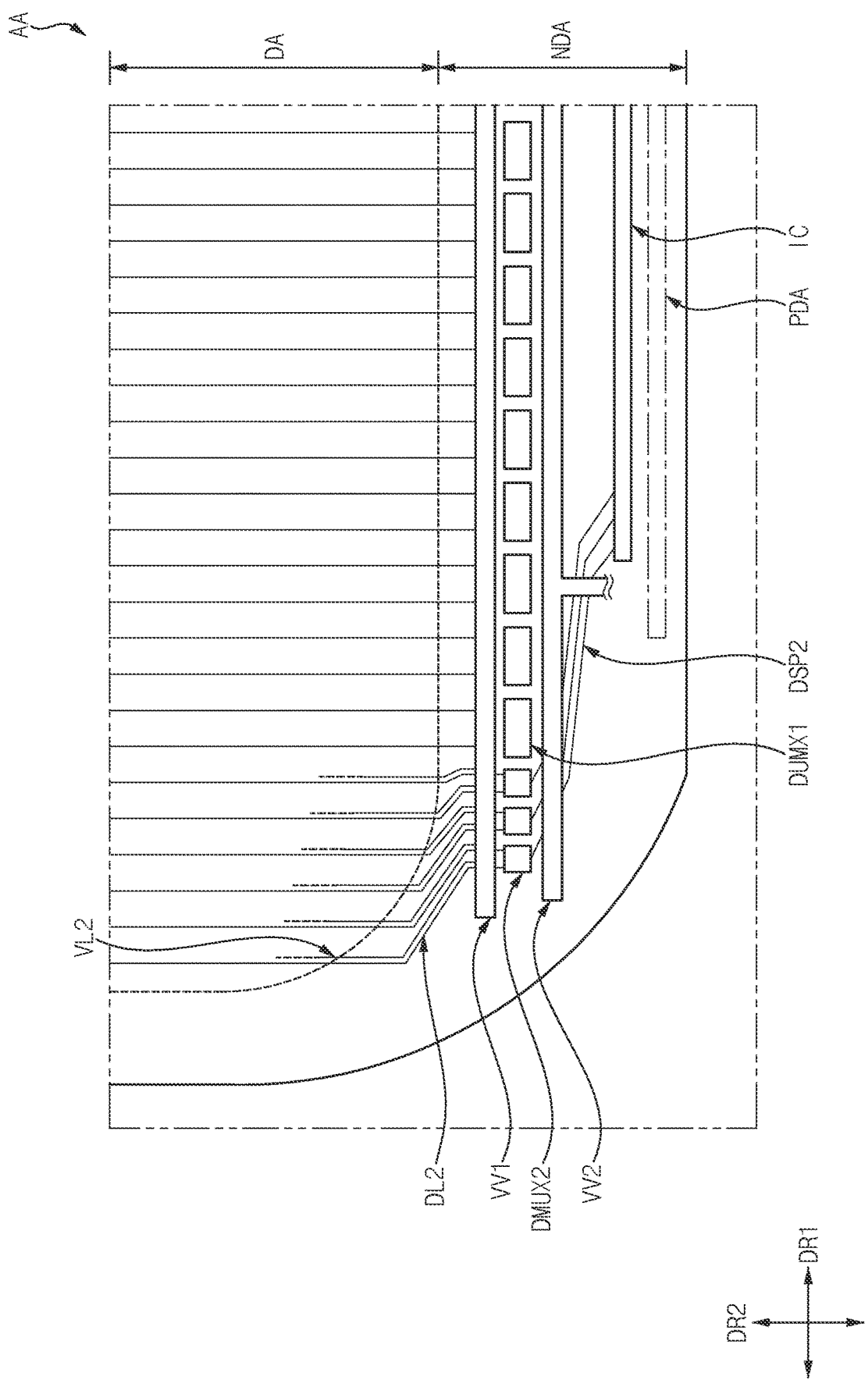

Referring to FIG. 2 and FIG. 5, the various components (refer to FIG. 3) for providing the data signal to the pixel PX in the display area DA and the various components (refer to FIG. 4) for providing the constant voltage signal to the pixel PX in the display area DA may be disposed in the peripheral area NDA at the same time.

In FIG. 5, for convenience of illustration and description, the first data line DL1 described with reference to FIG. 3 is not shown, and the first constant voltage transfer line VL1, the horizontal transfer line VL_H, and the constant voltage bridge electrode VCL described with reference to FIG. 4 are not shown.

In an embodiment, each of the second data line DL2 and the second constant voltage transfer line VL2 may be provided in plural. In an embodiment, the second data lines DL2 may be correspond to the second constant voltage transfer lines VL2 in one-to-one correspondence. In an embodiment, for example, the number of the second data lines DL2 may be the same as the number of the second constant voltage transfer lines VL2.

In an embodiment, as shown in FIG. 5, the second data lines DL2 and the second constant voltage transfer lines VL2 may be alternately arranged in the display area DA and the peripheral area NDA.

In such an embodiment, the pixels PX included in one of the second pixel columns PX_C2 disposed adjacent to the round-type edge RE may share one of the second data lines DL2 and one of the second constant voltage transfer lines VL2.

As described above, in the display panel DPa according to an embodiment, the pixels PX included in one second pixel column PX_C2 may receive the data signal from one second data line DL2, and at the same time, may receive the constant voltage signal from one second constant voltage transfer line VL2.

The pixels PX included in one second pixel column PX_C2 may directly receive the constant voltage signal from one second constant voltage transfer line VL2. Accordingly, a luminance drop that occurs when the constant voltage signal is not substantially transmitted to the pixels PX (or is relatively less transmitted to the pixels PX) included in the second pixel column PX_C2 may be effectively prevented.

In a case where the second constant voltage transfer line VL2 does not exist, the pixels PX included in the second pixel column PX_C2 may receive the constant voltage signal through the horizontal transfer line VL_H electrically connected to the first constant voltage transfer line VL1. In this case, the constant voltage may not be substantially transmitted to the pixels PX (or may be relatively less transmitted to the pixels PX) included in the second pixel column PX_C2, and accordingly, a luminance drop in the pixels PX included in the second pixel column PX_C2 may occur.

In an embodiment, the first and second demultiplexer units DMUX1 and DMUX2 for demuxing the data signal may be disposed between the first constant voltage transfer electrode VV1 and the second constant voltage transfer electrode VV2 to reduce a planar area of the peripheral area NDA (that is, to reduce an area of dead space).

Accordingly, in such an embodiment, the first constant voltage transfer electrode VV1 may overlap the second data line DL2 in a plan view. In such an embodiment, the first constant voltage transfer electrode VV1 and the second data lien DL2 are be desired to be electrically insulated from each other so that the constant voltage signal and the data signal do not interfere with each other. In an embodiment, at least a portion of the second data line DL2 overlapping the first constant voltage transfer electrode VV1 in a plan view may be disposed in (or directly on) a different layer from a layer in which the first constant voltage transfer electrode VV1 is disposed. These will be described later in detail with reference to FIG. 16.

In an embodiment, the second constant voltage transfer electrode VV2 may overlap the second data spider line DSP2 in a plan view. In such an embodiment, the second constant voltage transfer electrode VV2 and the second data spider line DSP2 are desired to be electrically insulated from each other so that the constant voltage and the data signal do not interfere with each other. In an embodiment, at least a portion of the second data spider line DSP2 overlapping the second constant voltage transfer electrode VV2 in a plan view may be disposed in a different layer from a layer in which the second constant voltage transfer electrode VV2 is disposed.

In an embodiment, although not shown in FIG. 5, the first constant voltage transfer electrode VV1 may overlap the first data line DL1 in a plan view, and the second constant voltage transfer electrode VV2 may overlap the first data spider line DSP1. In such an embodiment, at least a portion of the first data line DL1 overlapping the first constant voltage transfer electrode VV1 may be disposed in a different layer from the layer in which the first constant voltage transfer electrode VV1 is disposed, and at least a portion of the first data spider line DSP1 overlapping the second constant voltage transfer electrode VV2 may be disposed in a different layer from the layer in which the second constant voltage transfer electrode VV2 disposed.

Figure 6:
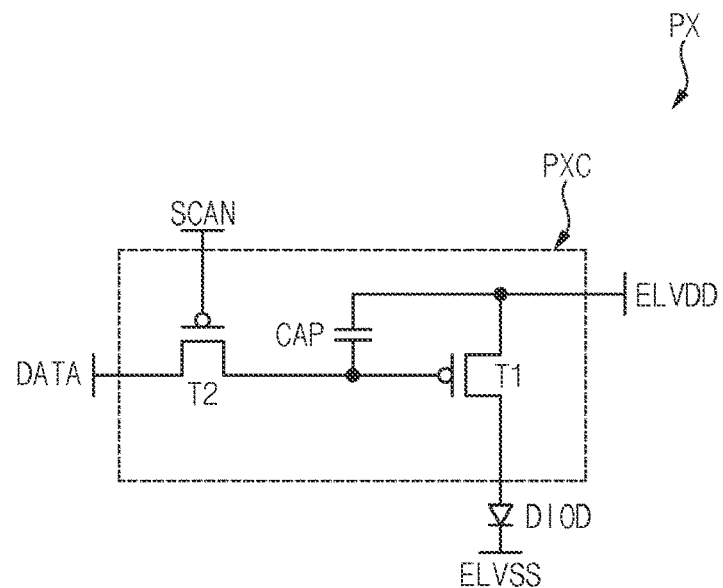
FIG. 6 and FIG. 7 are diagrams illustrating a pixel included in the display panel of FIG. 1.
Figure 7:
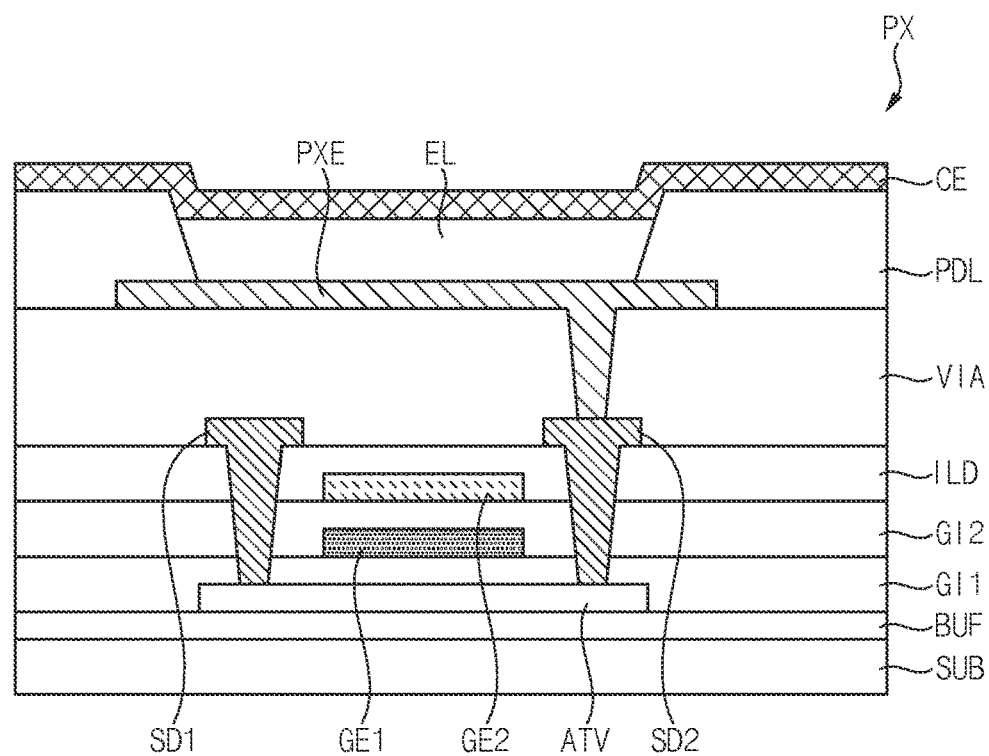

FIG. 6 and FIG. 7 are diagrams illustrating a pixel included in the display panel of FIG. 1. FIG. 6 is a circuit diagram illustrating the pixel PX, and FIG. 7 is a cross-sectional view illustrating a portion of the pixel PX.

Referring to FIG. 6, an embodiment of the pixel PX may include at least a first transistor T1, a second transistor T2, a capacitor CAP, and a light emitting element DIOD. In such an embodiment, the first transistor T1, the second transistor T2, and the capacitor CAP may be referred to as a pixel circuit PXC.

A scan signal SCAN may be provided to a gate electrode of the second transistor T2, and a data signal DATA may be provided to an input electrode of the second transistor T2. The second transistor T2 may transmit the data signal DATA to a gate electrode of the first transistor T1 in response to the scan signal SCAN in an active level.

A first electrode of the capacitor CAP may be connected to an output electrode of the second transistor T2, and a constant voltage signal ELVDD may be provided to a second electrode of the capacitor CAP. The capacitor CAP may store a voltage corresponding to a difference between a voltage received from the second transistor T2 and a voltage corresponding to the constant voltage signal ELVDD.

The first transistor T1 may receive the constant voltage signal ELVDD, and may be connected to the capacitor CAP. The first transistor T1 may control a driving current flowing to the light emitting element DIOD in response to a voltage stored in the capacitor CAP. In this case, the light emitting element DIOD may emit light having a luminance by the driving current.

Although, FIG. 6 shows an embodiment of the pixel circuit PXC including two transistors T1 and T2 and one capacitor CAP, the invention is not limited thereto. In an alternative embodiment, for example, the pixel circuit PXC may include three or more transistors. In another alternative embodiment, for example, the pixel circuit PXC may include two or more capacitors.

In addition, although FIG. 6 shows an embodiment where the transistors (for example, T1 and T2) included in the pixel circuit PXC are P-type metal-oxide-semiconductor (P-MOS) circuit, the invention is not limited thereto. In an embodiment, for example, transistors included in the pixel circuit may be N-type metal-oxide-semiconductor (N-MOS) circuit. In an alternative embodiment, for example, some transistors included in the pixel circuit may be P-MOS transistors, and the other transistors included in the pixel circuit may be N-MOS transistors.

Referring to FIG. 7, the pixel PX may include various components disposed on a substrate SUB. In an embodiment, for example, the pixel PX may include a plurality of insulation layers, a plurality of conductive layers, and the light emitting element DIOD. Hereinafter, for convenience of description, the pixel PX will be described according to stacking order of the various components.

A buffer layer BUF may be disposed on the substrate SUB. The buffer layer BUF may block penetration of impurities, moisture, or gas from the substrate SUB, and may provide a flat surface on the substrate SUB. The buffer layer BUF may include an inorganic material such as oxide or nitride, an organic material, or an organic/inorganic material, and may have a single-layer or multi-layer structure.

A semiconductor layer ATV may be disposed on the buffer layer BUF. The semiconductor layer ATV may include a semiconductor material. In an embodiment, for example, the semiconductor layer ATV may include a silicon semiconductor material and/or an oxide semiconductor material.

A first gate insulation layer GI1 may be disposed on the buffer layer BUF. The first gate insulation layer GI1 may cover the semiconductor layer ATV. The first gate insulation layer GI1 may include an inorganic insulation material.

A first gate electrode GE1 may be disposed on the first gate insulation layer GI1. The first gate electrode GE1 may be electrically insulated from the semiconductor layer ATV by the first gate insulation layer GI1. At least a portion of the first gate electrode GE1 may overlap at least a portion of the semiconductor layer ATV. In this case, the portion of the first gate electrode GE1 overlapping the semiconductor layer AVT may define the gate electrode of the first transistor T1.

A second gate insulation layer GI2 may be disposed on the first gate insulation layer GI1. The second gate insulation layer GI2 may cover the first gate electrode GE1. The second gate insulation layer GI2 may include an inorganic insulation material.

A second gate electrode GE2 may be disposed on the second gate insulation layer GI2. The second gate electrode GE2 may be electrically insulated from the first gate electrode GE1 by the second gate insulation layer GI2. At least a portion of the second gate electrode GE2 may overlap at least a portion of the first gate electrode GE1. In this case, the portion of the second gate electrode GE2 and the portion of the first gate electrode GE1 overlapping each other may define the capacitor CAP.

An interlayer insulation layer ILD may be disposed on the second gate insulation layer GI2. The interlayer insulation layer ILD may cover the second gate electrode GE2. The interlayer insulation layer ILD may include an inorganic material, an organic material, or an inorganic/organic material.

A first source-drain electrode SD1 and a second source-drain electrode SD2 may be disposed the interlayer insulation layer ILD. Each of the first source-drain electrode SD1 and the second source-drain electrode SD2 may electrically contact the semiconductor layer ATV through a penetrating hole defined through the interlayer insulation layer ILD, the second gate insulation layer GI2, and the first gate insulation layer GI1 and exposing a portion of the semiconductor layer ATV. In this case, the first source-drain electrode SD1, the second source-drain electrode SD2, the first gate electrode GE1, and the semiconductor layer ATV may collectively define the first transistor T1.

A via insulation layer VIA may be disposed on the interlayer insulation layer ILD. The via insulation layer VIA may cover the first source-drain electrode SD1 and the second source-drain electrode SD2. The via insulation layer VIA may include an organic insulation material.

A pixel electrode PXE may be disposed on the via insulation layer VIA. The pixel electrode PXE may electrically contact the second source-drain electrode SD2 through a penetrating hole defined through the via insulation layer VIA and exposing a portion of the second source-drain electrode SD2. In an embodiment, the pixel electrode PXE may be referred to as an anode electrode.

A pixel defining layer PDL may be disposed on the via insulation layer VIA. The pixel defining layer PDL may define (or is provided with) a pixel opening exposing at least a portion of the pixel electrode PXE. The pixel defining layer PDL may include an organic insulation material.

A light emitting layer EL may be disposed on the pixel electrode PXE in the pixel opening. In an embodiment, the light emitting layer EL may include at least one of organic light emitting layer.

A common electrode layer CE may be disposed on the pixel defining layer PDL, and may cover the light emitting layer EL disposed in the pixel opening. The pixel electrode PXE, the light emitting layer EL, and the common electrode layer CE may define the light emitting element DIOD. In an embodiment, the common electrode layer CE may be referred to as a cathode electrode.

Each of the buffer layer BUF, the first gate insulation layer GIL the second gate insulation layer GI2, the interlayer insulation layer ILD, and the via insulation layer VIA may extend from the display area DA to the peripheral area NDA.

Figure 8:
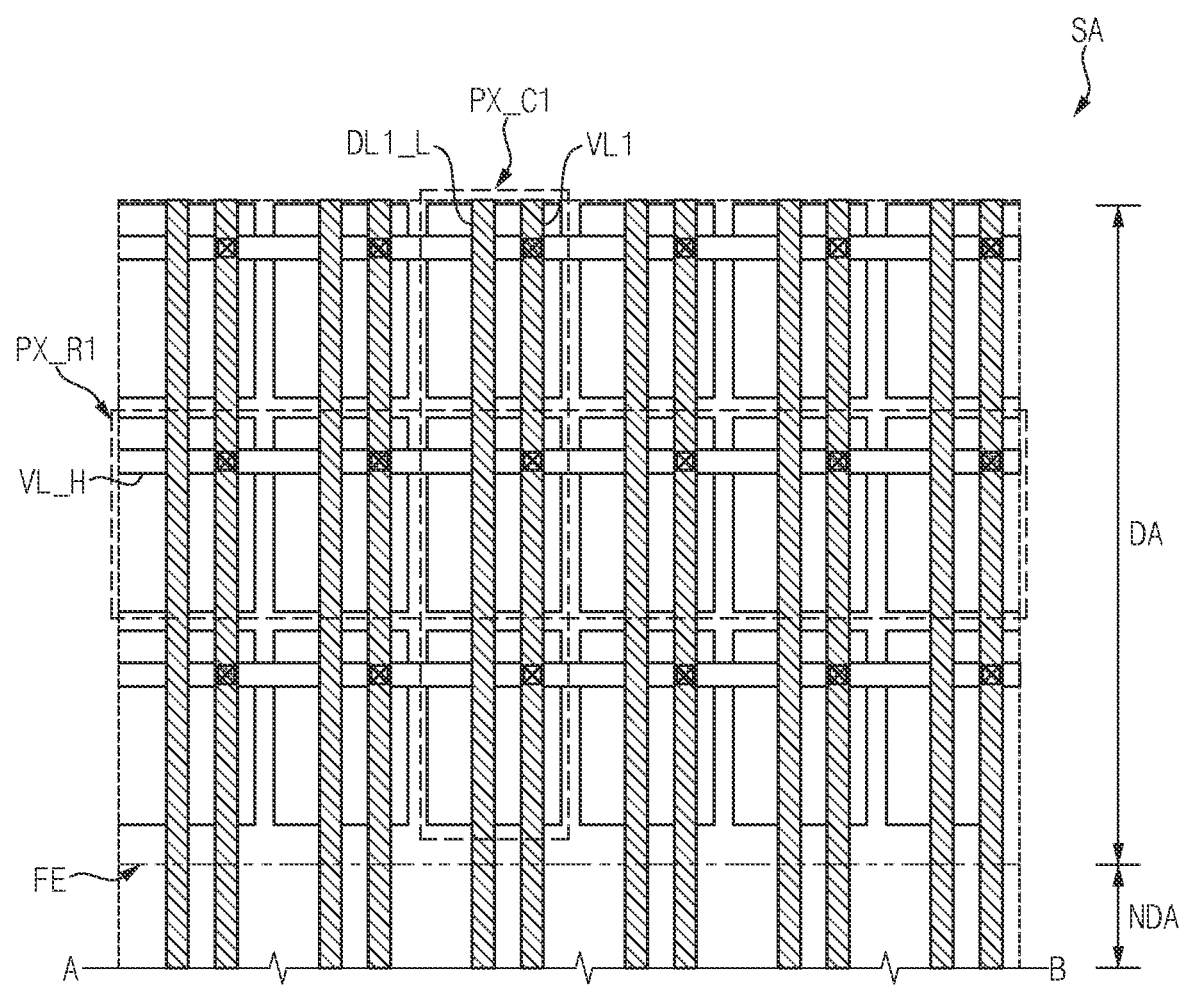
FIG. 8 and FIG. 9 are plan views illustrating a plan area of FIG. 2.
Figure 9:
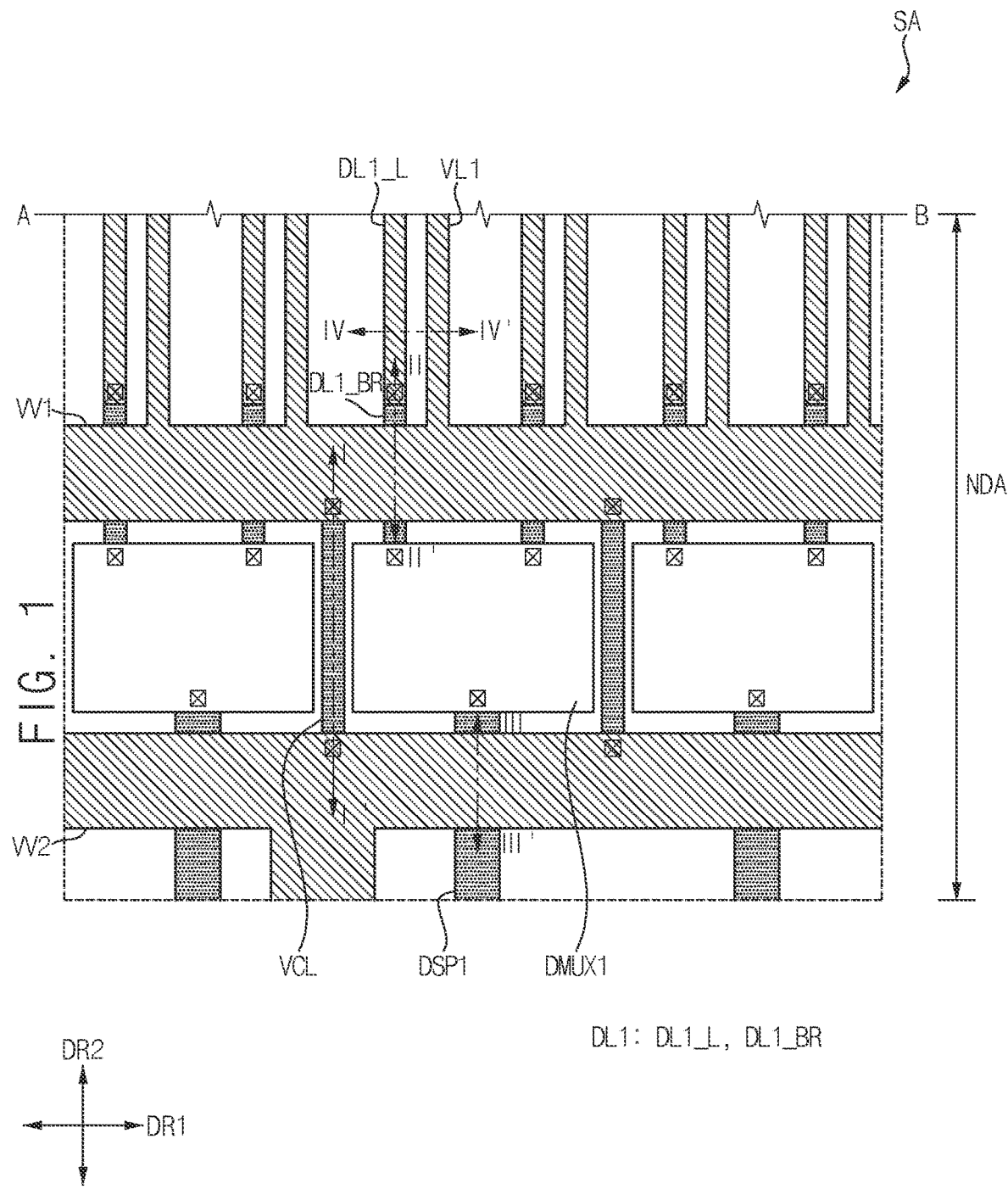
Figure 10:
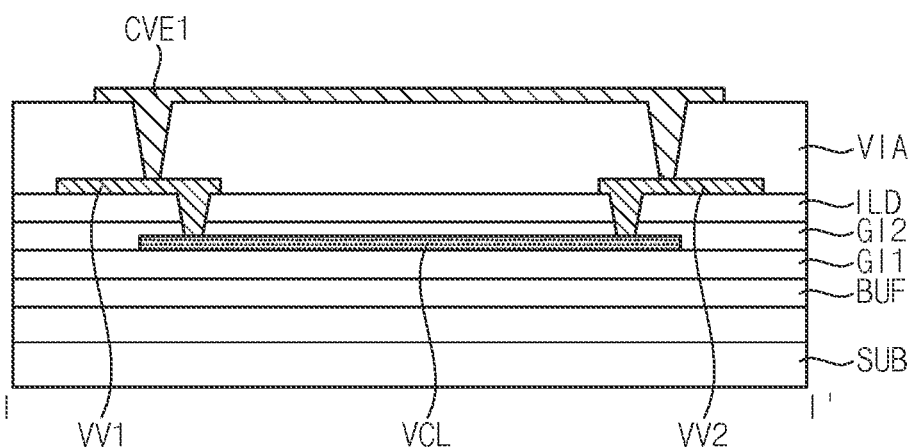
FIG. 10 is a cross-sectional view taken along line I-I' of FIG. 9.
Figure 11:
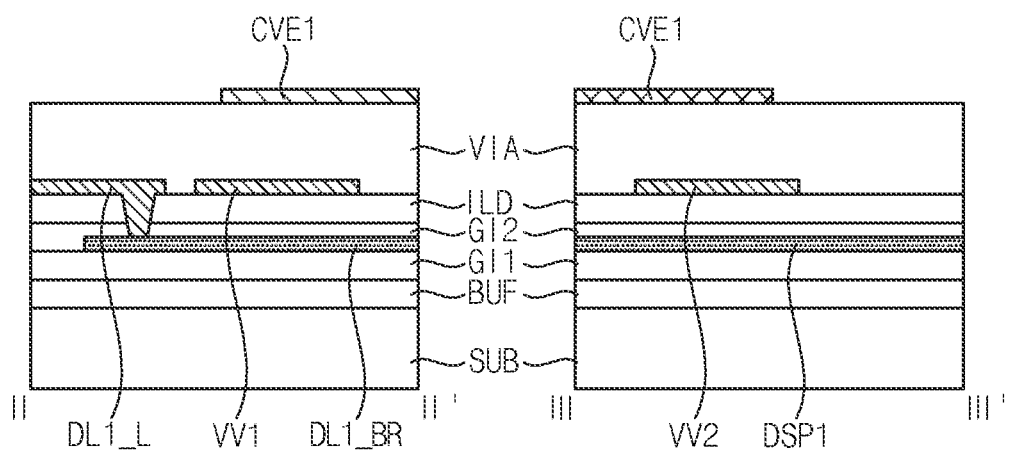
FIG. 11 is a cross-sectional view taken along line II-H' and line of FIG. 9.
Figure 12:
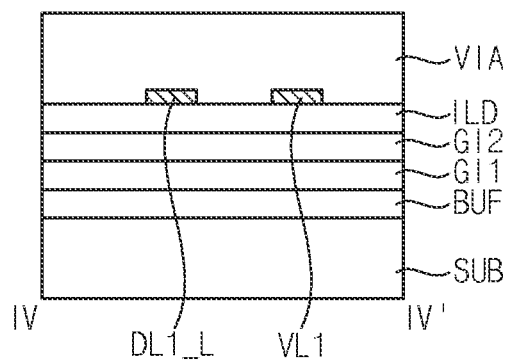
FIG. 12 is a cross-sectional view taken along line IV-IV' of FIG. 9.

FIG. 8 and FIG. 9 are plan views illustrating a plan area of FIG. 2. FIG. 10 is a cross-sectional view taken along line I-I' of FIG. 9. FIG. 11 is a cross-sectional view taken along line II-II' and line of FIG. 9. FIG. 12 is a cross-sectional view taken along line IV-IV' of FIG. 9. Particularly, FIG. 8 is an enlarged plan view of an upper portion of line A-B of FIG. 2 in the flat area SA, and FIG. 9 is an enlarged plan view of a lower portion of line A-B of FIG. 2 in the flat area SA.

Referring to FIG. 8 and FIG. 9, in an embodiment, the pixel PX may be disposed in the display area DA adjacent to the flat-type edge FE. such an embodiment, the pixel PX may be provided in plural, and a part of the pixels PX may be arranged in the first direction DR1 along the flat-type edge FE extending in the first direction DR1.

In the display area DA adjacent to the flat-type edge FE, the pixels PX arranged along the second direction DR2 may be defined as the first pixel column PX_C1, and the pixels PX arranged along the first direction DR1 may be defined as a first pixel row PX_R1. In an embodiment, each of the first pixel column PX_C1 and the first pixel row PX_R1 may be provided in plural.

In an embodiment, as shown in FIG. 9, the first constant voltage transfer line VL1 may be integrally formed with the first constant voltage transfer electrode VV1 as a single unitary and indivisible part. That is, the first constant voltage transfer line VL1 may be defined as a line branching from and extending from the first constant voltage transfer electrode VV1.

In an embodiment, the first constant voltage transfer line VL1 may extend to the display area DA via the flat-type edge FE. In such an embodiment, the first constant voltage transfer lien VL1 may extend in the second direction DR2 in the peripheral area NDA and the display area DA.

The first data line DL1 may include a first bridge line DL1_BR and a first data transfer line DL1_L.

The first bridge line DL1_BR may be electrically connected to the first demultiplexer unit DMUX1 in the peripheral area NDA. The first bridge line DL1_BR may overlap the first constant voltage transfer electrode VV1. In this case, the first bridge line DL1_BR may be electrically insulated from the first constant voltage transfer electrode VV1. In other words, the first bridge line DL1_BR may be disposed in a different layer from a layer in which the first constant voltage transfer electrode VV1 is disposed. These may be described later with reference to FIG. 11.

The first data transfer line DL1_L may be electrically connected to the first bridge line DL1_BR in the peripheral area NDA. Accordingly, the first data transfer line DL1_L may receive the data signal from the first demultiplexer unit DMUX1 through the first bridge line DL1_BR. In addition, the first data transfer line DL1_L may extend to the display area DA via the flat-type edge FE. In this case, the first data transfer line DL1_L may extend in the second direction DR2 in the peripheral area NDA and the display area DA.

As shown in FIG. 8, the pixels PX included in one first pixel column PX_C1 may share one first constant voltage transfer line VL1 and one first data transfer line DL1_L.

In addition, the pixels PX included in one first pixel row PX_R1 may share one horizontal transfer line VL_H, and the horizontal transfer line VL_H may be electrically connected to the first constant voltage transfer line VL1 and may be electrically insulated from the first data transfer line DL1_L. In such an embodiment, the horizontal transfer line VL_H may be disposed in a different layer from a layer in which the first constant voltage transfer line VL1 is disposed and a different from a layer in which the first data transfer line DL1_L is disposed.

In an embodiment, the horizontal transfer line VL_H may be disposed in a same layer (for example, on the first gate insulation layer GI1) as a layer in which the first gate electrode GE1 (shown in FIG. 7) is disposed, and each of the first constant voltage transfer line VL1 and the first data transfer line DL1_L may be disposed in a same layer (for example, on the interlayer insulation layer ILD) as a layer in which the first and second source-drain electrodes SD1 and SD2 (shown in FIG. 7) are disposed. In this case, the first constant voltage transfer line VL1 may electrically contact the horizontal transfer line VL_H through a penetrating hole defined through the interlayer insulation layer ILD and the second gate insulation layer GI2.

Here, "disposed in (or directly on) a same layer" is defined as having substantially same meaning as "defined by portions of a same layer" or "formed at the same time through a same process using a same material". In an embodiment, for example, when the horizontal transfer line VL_H is disposed in a same layer as a layer in which the first gate electrode GE1 is disposed, the horizontal transfer line VL_H and the first gate electrode GE1 may include a same material as each other and may be substantially simultaneously formed during a same process.

In an alternative embodiment, the horizontal transfer line VL_H may be disposed in a same layer as a layer in which the second gate electrode GE2 shown in FIG. 7 is disposed, and each of the first constant voltage transfer line VL1 and the first data transfer line DL1_L may be disposed in a same layer as a layer in which the first and second source-drain electrodes SD1 and SD2 (shown in FIG. 7) are disposed. In such an embodiment, the first constant voltage transfer line VL1 may electrically contact the horizontal transfer line VL_H through a penetrating hole defined through the interlayer insulation layer ILD.

Accordingly, in the display area DA adjacent to the flat-type edge FE, the pixels PX may receive the constant voltage signal through the first constant voltage transfer line VL1 and/or the horizontal transfer line VL_H, and may receive the data signal through the first data transfer line DL1_L.

Referring to FIG. 9 and FIG. 10, in an embodiment, each of the first constant voltage transfer electrode VV1 and the second constant voltage transfer electrode VV2 may be disposed in a same layer (for example, in a layer directly on the interlayer insulation layer ILD) as a layer in which the first and second source-drain electrodes SD1 and SD2 (shown in FIG. 7) are disposed.

In an embodiment, the first demultiplexer unit DMUX1 may be provided in plural, and the constant voltage bridge electrode VCL may be disposed between two adjacent first demultiplexer units DMUX1 in a plan view. In such an embodiment, the constant voltage bridge electrode VCL may be disposed in a same layer (for example, on the first gate insulation layer GI1) as a layer in which the first gate electrode GE1 (shown in FIG. 7) is disposed.

The first constant voltage bridge electrode VCL may electrically connect the first constant voltage transfer electrode VV1 and the second constant voltage transfer electrode VV2 to each other. In an embodiment, each of the first constant voltage transfer electrode VV1 and the second constant voltage transfer electrode VV2 may electrically contact (or be electrically connected to) the constant voltage bridge electrode VCL through a penetrating hole defined through the interlayer insulation layer ILD and the second gate insulation layer GI2.

In an embodiment, although not shown in FIG. 9, the display panel DPa may further include a first cover electrode CVE1 (shown in FIG. 11). The first cover electrode CVE1 may be disposed in a same layer (for example, on the via insulation layer VIA) as a layer in which the pixel electrode PXE (shown in FIG. 7) is disposed.

The first cover electrode CVE1 may electrically connect the first constant voltage transfer electrode VV1 and the second constant voltage transfer electrode VV2 to each other in the peripheral area NDA adjacent to the flat-type edge FE. In an embodiment, each of the first constant voltage transfer electrode VV1 and the second constant voltage transfer electrode VV2 may electrically contact the first cover electrode CVE1 through a penetrating hole defined through the via insulation layer VIA.

In such an embodiment, the first cover electrode CVE1 may have various planar shapes capable of electrically connecting the first constant voltage transfer electrode VV1 and the second constant voltage transfer electrode VV2 to each other. In an embodiment, for example, the first cover electrode CVE1 may be disposed to entirely cover the first demultiplexer unit DMUX1 and the constant voltage bridge electrode VCL in a plan view. However, the planar shape of the first cover electrode CVE1 is not limited thereto.

Referring to FIG. 9 and FIG. 11, in an embodiment, the first bridge line DL1_BR may be disposed in a same layer (for example, on the first gate insulation layer GI1) as a layer in which the first gate electrode GE1 (shown in FIG. 7) is disposed.

In such an embodiment, the first data transfer line DL1_L may be disposed in a same layer (for example, on the interlayer insulation layer ILD) as a layer in which the first and second source-drain electrodes SD1 and SD2 (shown in FIG. 7) are disposed, and may be electrically connected to the first bridge line DL1_BR. In an embodiment, for example, the first data transfer line DL1_L may electrically contact the first bridge line DL1_BR through a penetrating hole defined through the interlayer insulation layer ILD1 and the second gate insulation layer GI2.

In an alternative embodiment, unlike shown in FIG. 11, the first bridge line DL1_BR may be disposed in a same layer (for example, on the second gate insulation layer GI2) as a layer in which the second gate electrode GE2 (shown in FIG. 7) is disposed. In this case, the first data transfer line DL1_L may be disposed in a same layer (for example, on the interlayer insulation layer ILD) as a layer in which the first and the second source-drain electrodes SD1 and SD2 (shown in FIG. 7) are disposed, and may electrically contact the first bridge line DL1_BR through a penetrating hole defined through the interlayer insulation layer ILD.

In an embodiment, the first data spider line DSP1 may be disposed in a same layer (for example, on the first gate insulation layer GI1) as a layer in which the first gate electrode GE1 (shown in FIG. 7) is disposed. In such an embodiment, the first data spider line DSP1 may be electrically insulated from the second constant voltage transfer electrode VV2 by the second gate insulation layer GI2 and the interlayer insulation layer ILD.

In an alternative embodiment, the first data spider line DSP1 may be disposed in a same layer (for example, on the second gate insulation layer GI2) as a layer in which the second gate electrode GE2 (shown in FIG. 7) is disposed. In such an embodiment, the first data spider line DSP1 may be electrically insulated from the second constant voltage transfer electrode VV2 by the interlayer insulation layer ILD.

Referring to FIG. 9 and FIG. 12, the first data transfer line DL1_L may be disposed in a same layer as a layer in which the first constant voltage transfer line VL1 is disposed. In an embodiment, each of the first data transfer line DL1_L and the first constant voltage transfer line VL1 may be disposed in a same layer (for example, on the interlayer insulation layer ILD) as a layer in which the first and second source-drain electrodes SD1 and SD2 (shown in FIG. 7) are disposed. In such an embodiment, the first data transfer line DL1_L may be disposed to space apart from the first constant voltage transfer line VL1, and accordingly, the first data transfer line DL1_L may be electrically insulated from the first constant voltage transfer line VL1.

Figure 13:
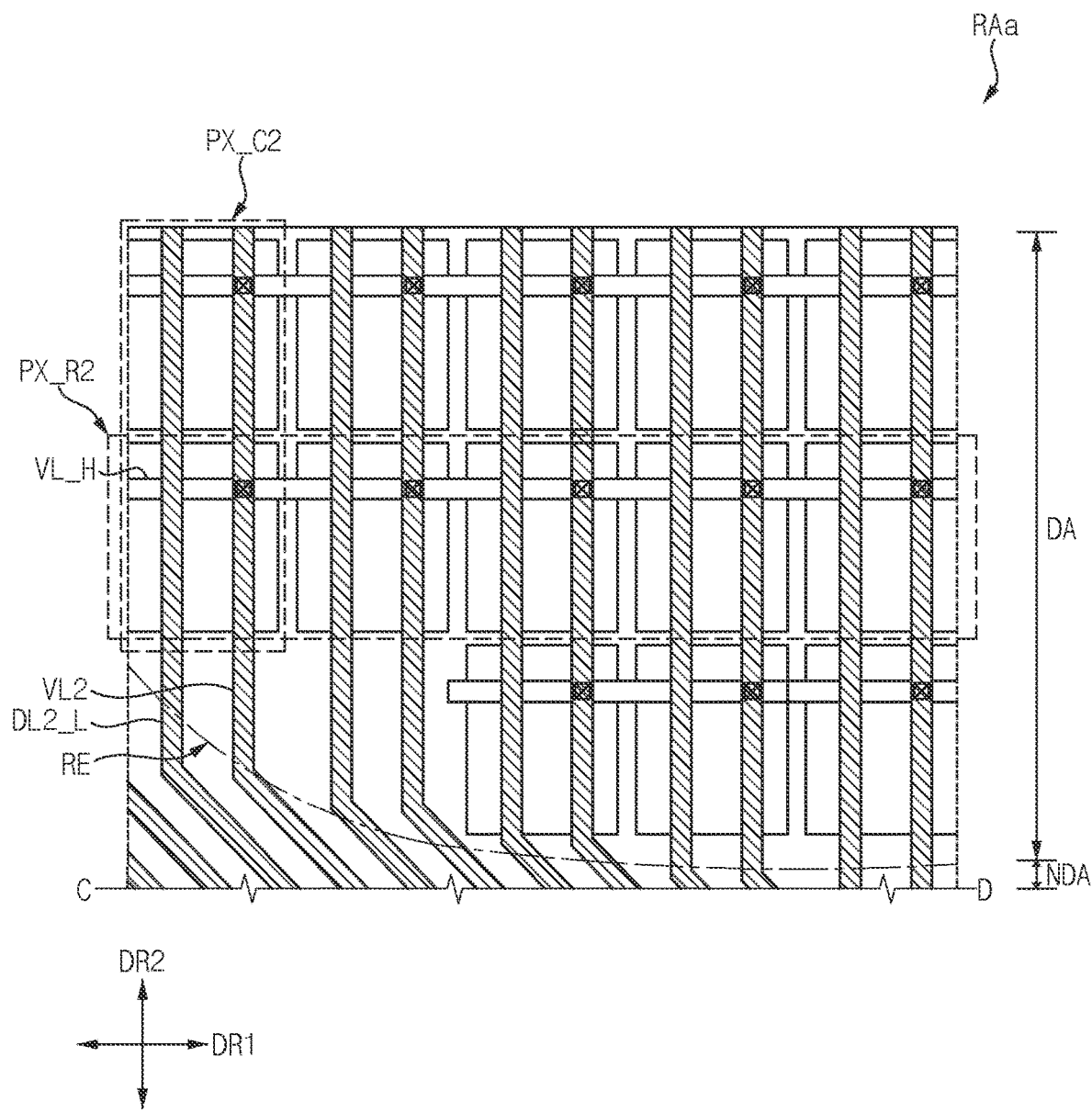
FIG. 13 and FIG. 14 are enlarged plan views of a round area of FIG. 2.
Figure 14:
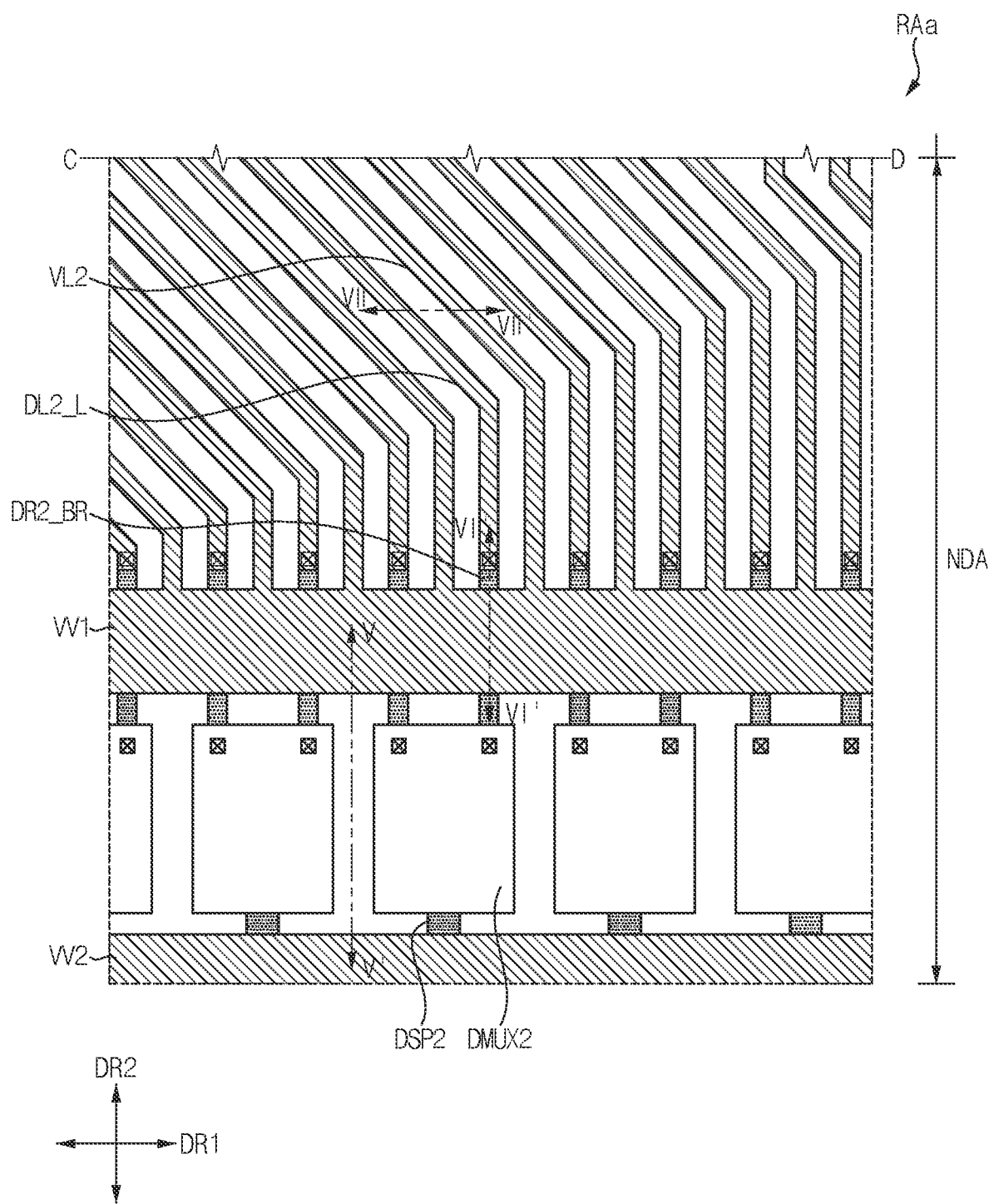
Figure 15:
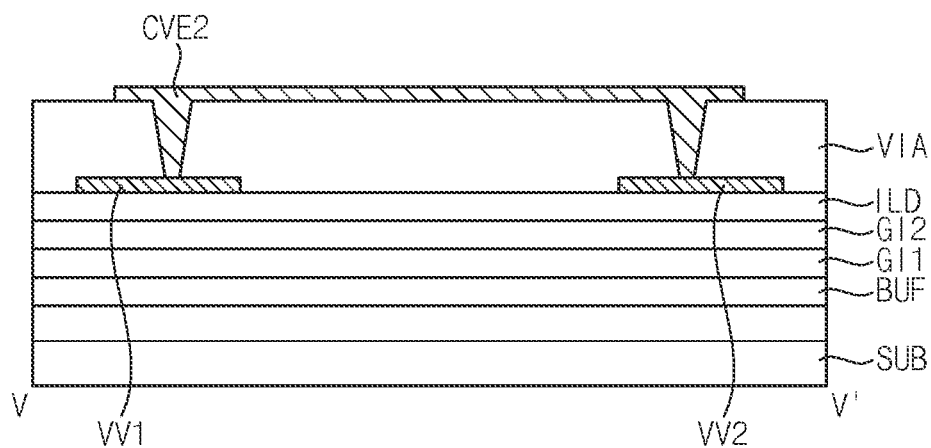
FIG. 15 is a cross-sectional view taken along line V-V' of FIG. 14.
Figure 16:
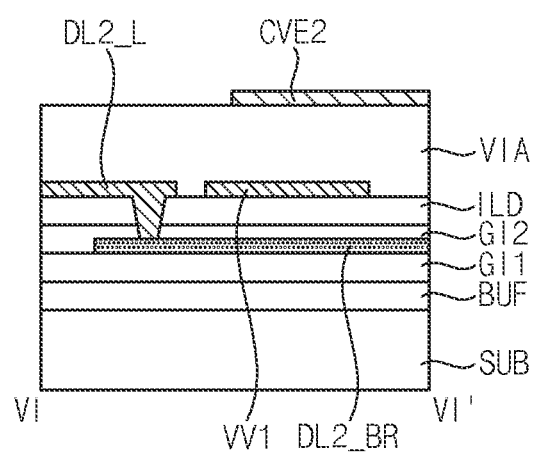
FIG. 16 is a cross-sectional view taken along line VI-VI' of FIG. 14.
Figure 17:
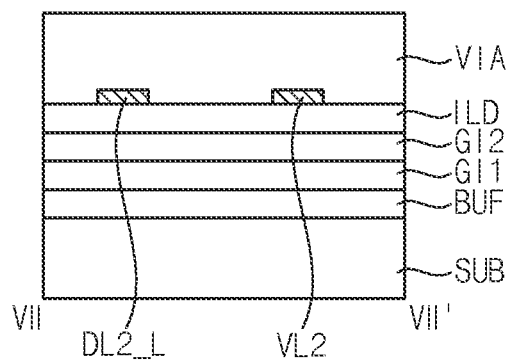
FIG. 17 is a cross-sectional view taken along line VII-VII' of FIG. 14.

FIG. 13 and FIG. 14 are enlarged plan views of a round area of FIG. 2. FIG. 15 is a cross-sectional view taken along line V-V' of FIG. 14. FIG. 16 is a cross-sectional view taken along line VI-VI' of FIG. 14. FIG. 17 is a cross-sectional view taken along line VII-VII' of FIG. 14. Particularly, FIG. 13 is an enlarged plan view of an upper portion of line C-D of FIG. 2 in the round area RAa, and FIG. 14 is an enlarged plan view of a lower portion of line C-D of FIG. 2 in the round area RAa.

Referring to FIG. 13 and FIG. 14, the pixel PX may be disposed in the display area DA adjacent to the round-type edge RE. In an embodiment, the pixel PX may be provided in plural, and a part of the pixels PX may be arranged stepwise (or in a stepwise manner) along the round-type edge RE.

In the display area DA adjacent to the round-type edge RE, the pixels PX arranged in the second direction DR2 may be defined as the second pixel column PX_C2, and the pixels PX arranged in the first direction DR1 may be defined as a second pixel row PX_R2. In an embodiment, each of the second pixel column PX_C1 and the second pixel row PX_R2 may be provide in plural in the display area DA.

Since the part of the pixels PX are arranged stepwise along the round-type edge RE, the number of the pixels PX included in each of the second pixel columns PX_C2 may not be constant. Similarly, the number of the pixels PX included in each of the second pixel rows PX_R2 may not be constant.

In an embodiment, as shown in FIG. 14, the second constant voltage transfer line VL2 may be integrally formed with the first constant voltage transfer electrode VV1 as a single unitary and indivisible part. That is, the second constant voltage transfer line VL2 may be defined as a line branching from and extending from the first constant voltage transfer electrode VV1.

In an embodiment, the second constant voltage transfer line VL2 may extend to the display area DA via the round-type edge RE. In such an embodiment, a portion of the second constant voltage transfer line VL2 branching from the first constant voltage transfer electrode VV1 may be spaced apart from a portion of the second constant voltage transfer line VL2 disposed in the display area DA in the first direction DR1.

The second data line DL2 may include a second bridge line DL2_BR and a second data transfer line DL2_L.

The second bridge line DL2_BR may be electrically connected to the second demultiplexer unit DMUX2 in the peripheral area NDA. The second bridge line DL2_BR may overlap the first constant voltage transfer electrode VV1 in a plan view. In an embodiment, the second bridge line DL2_BR may be electrically insulated from the first constant voltage transfer electrode VV1. In such an embodiment, the second bridge line DL2_BR may be disposed in a different layer from a layer in which the first constant voltage transfer electrode VV1 is disposed. These will be described later with reference to FIG. 16.

The second data transfer line DL2_L may be electrically connected to the second bridge line DL2_BR in the peripheral area NDA. Accordingly, the second data transfer line DL2_L may receive the data signal from the second demultiplexer unit DMUX2 through the second bridge line DL2_BR. In addition, the second data transfer line DL2_L may extend to the display area DA via the round-type edge RE. In such an embodiment, a portion of the second data transfer line DL2_L connected to the second bridge line DL2_BR may be spaced apart from a portion of the second data transfer line DL2_L disposed in the display area DA in the first direction DR1.

In an embodiment, as shown in FIG. 13, the pixels PX included in one second pixel column PX_C2 may share one second constant voltage transfer line VL2 and one second data transfer line DL2_L.

In addition, the pixels PX included in one second pixel row PX_R2 may share one horizontal transfer line VL_H, and the horizontal transfer line VL_H may be electrically connected to the second constant voltage transfer line VL2 and may be electrically insulated from the second data transfer line DL2_L. In such an embodiment, the horizontal transfer line VL_H may be disposed in a different layer from a layer in which the second constant voltage transfer line VL2 is disposed and from a layer in which the second data transfer line DL2_L is disposed.

In an embodiment, for example, the horizontal transfer line VL_H may be disposed in a same layer (for example, on the first gate insulation layer GI1) as a layer in which the first gate electrode GE1 (shown in FIG. 7) is disposed, and each of the second constant voltage transfer line VL2 and the second data transfer line DL2_L may be disposed in a same layer (for example, on the interlayer insulation layer ILD) as a layer in which the first and second source-drain electrodes SD1 and SD2 are disposed. In such an embodiment, the second constant voltage transfer line VL2 may electrically contact the horizontal transfer line VL_H through a penetrating hole defined through the interlayer insulation layer ILD and the second gate insulation layer GI2.

In an alternative embodiment, for example, the horizontal transfer line VL_H may be disposed in a same layer (for example, on the second gate insulation layer GI2) as a layer in which the second gate electrode GE2 (shown in FIG. 7) is disposed, and each of the second constant voltage transfer line VL2 and the second data transfer line DL2_L may be disposed in a same layer (for example, on the interlayer insulation layer ILD) as a layer in which the first and second source-drain electrodes SD1 and SD2 are disposed. In such an embodiment, the second constant voltage transfer line VL2 may electrically contact the horizontal transfer line VL_H through a penetrating hole defined through the interlayer insulation layer ILD.

Accordingly, in the display area DA adjacent to the round-type edge RE, the pixels PX may receive the constant voltage signal through the second constant voltage transfer line VL2 and/or the horizontal transfer line VL_H and may receive the data signal through the second data transfer line DL2_L.

Referring to FIG. 14 and FIG. 15, in an embodiment, a planar area of the second demultiplexer unit DMUX2 may be relatively small. In an embodiment, for example, a planer area of the first demultiplexer unit DMUX1 (shown in FIG. 9) may be larger (or greater) than the planar area of the second demultiplexer unit DMUX2. Accordingly, in the peripheral area NDA adjacent to the round-type edge RE, an area in which the second demultiplexer unit DMUX2 is disposed may be reduced, and accordingly, a planar area of the peripheral area NDA adjacent to the round-type edge RE may be reduced.

In an embodiment, a width of the second demultiplexer unit DMUX2 in the first direction DR1 may be smaller (or less) than a width of the first demultiplexer unit DMUX1 (shown in FIG. 9) in the first direction. Accordingly, in the peripheral area NDA adjacent to the round-type edge RE, a width of the area in which the second demultiplexer unit DMUX2 is disposed in the first direction DR1 may be reduced, and accordingly, the planar area of the peripheral area NDA adjacent to the round-type edge RE may be reduced.

In an embodiment, as shown in FIG. 14, the second demultiplexer unit DMUX2 may be provided in plural. In such an embodiment, the constant voltage bridge electrode VCL (shown in FIG. 9) may not be disposed between two adjacent second demultiplexer units DMUX2. Accordingly, a distance between the two adjacent second demultiplexer units DMUX2 in the first direction DR1 may be smaller (or less) than a distance between the two adjacent first demultiplexer units DMUX1 (shown in FIG. 9) in the first direction DR1. Accordingly, the width of the area in which the second demultiplexer unit DMUX2 is disposed in the first direction DR1 may be reduced, and accordingly, the planar area of the peripheral area NDA adjacent to the round-type edge RE may be reduced.

In an embodiment, although not shown in FIG. 14, the display panel DPa may further include a second cover electrode CVE2 (shown in FIG. 16). The second cover electrode CVE2 may be disposed in a same layer (for example, on the via insulation layer VIA) as a layer in which the pixel electrode PXE is disposed.

The second cover electrode CVE2 may electrically connect the first constant voltage electrode VV1 and the second constant voltage electrode VV2 in the peripheral area NDA adjacent to the round-type edge RE. In an embodiment, the second cover electrode CVE2 may electrically contact each of the first constant voltage transfer electrode VV1 and the second constant voltage transfer electrode VV2 through a penetrating hole defined through the via insulation layer VIA.

In such an embodiment, the second cover electrode CVE2 may have various planar shapes capable of electrically connecting the first constant voltage transfer electrode VV1 and the second constant voltage transfer electrode VV2 to each other. In an embodiment, for example, the second cover electrode CVE2 may be disposed to entirely cover the second demultiplexer unit DMUX2 in a plan view. However, the planar shape of the second cover electrode CVE2 is not limited thereto.

In an embodiment, the second cover electrode CVE2 may be integrally formed with the first cover electrode CVE1 as a single unitary and indivisible part. However, the invention is not limited thereto. In an alternative embodiment, for example, the second cover electrode CVE2 may be separately formed from the first cover electrode CVE1.

Referring to FIG. 14 and FIG. 16, in an embodiment, the second bridge line DL2_BR may be disposed in a same layer (for example, on the first gate insulation layer GI1) as a layer in which the first gate electrode GE1 (shown in FIG. 7) is disposed.

In such an embodiment, the second data transfer line DL2_L may be disposed in a same layer (for example, on the interlayer insulation layer ILD) as a layer in which the first and the second source-drain electrodes SD1 and SD2 (shown in FIG. 7) are disposed. In such an embodiment, the second data transfer line DL2_L may electrically contact the second bridge line DL2_BR through a penetrating hole defined through the interlayer insulation layer ILD and the second gate insulation layer GI2.

In an alternative embodiment, the second bridge line DL2_BR may be disposed in a same layer (for example, on the second gate insulation layer GI2) as a layer in which the second gate electrode GE2 (shown in FIG. 7) is disposed. In such an embodiment, the second data transfer line DL2_L may be disposed in a same layer (for example, in a layer directly on the interlayer insulation layer ILD) as a layer in which the first and the second source-drain electrodes SD1 and SD2 (shown in FIG. 7) are disposed. In such an embodiment, the second data transfer line DL2_L may electrically contact the second bridge line DL2_BR through a penetrating hole defined through the interlayer insulation layer ILD.

In an embodiment, although not shown in FIG. 16, the second data spider line DSP2 may be disposed in a same layer as a layer in which the first data spider line DSP1 (shown in FIG. 11) is disposed. Accordingly, the second data spider line DSP2 may be electrically insulated from the second constant voltage transfer electrode VV2.

Referring to FIG. 14 and FIG. 17, the second data transfer line DL2_L may be disposed in a same layer as a layer in which the second constant voltage transfer line VL2 is disposed. In an embodiment, each of the second data transfer line DL2_L and the second constant voltage transfer line VL2 may be disposed in a same layer (for example, on the interlayer insulation layer ILD) as a layer in which the first and second source-drain electrodes SD1 and SD2 (shown in FIG. 7) are disposed. In such an embodiment, the second data transfer line DL2_L may be disposed to space apart from the second constant voltage transfer line VL2, and accordingly, the second data transfer line DL2_L may be electrically insulated from the second constant voltage transfer line VL2.

Hereinafter, a display panel according to an alternative embodiment will be described with reference to FIGS. 18 to 25. Hereinafter, any repetitive detailed description of components substantially same as (or similar to) the components described with reference to FIGS. 1 to 17 will be omitted, and same (or similar) reference sings may be used for components that are substantially same as (or similar to) the components described with reference to FIGS. 1 to 17.

Figure 18:
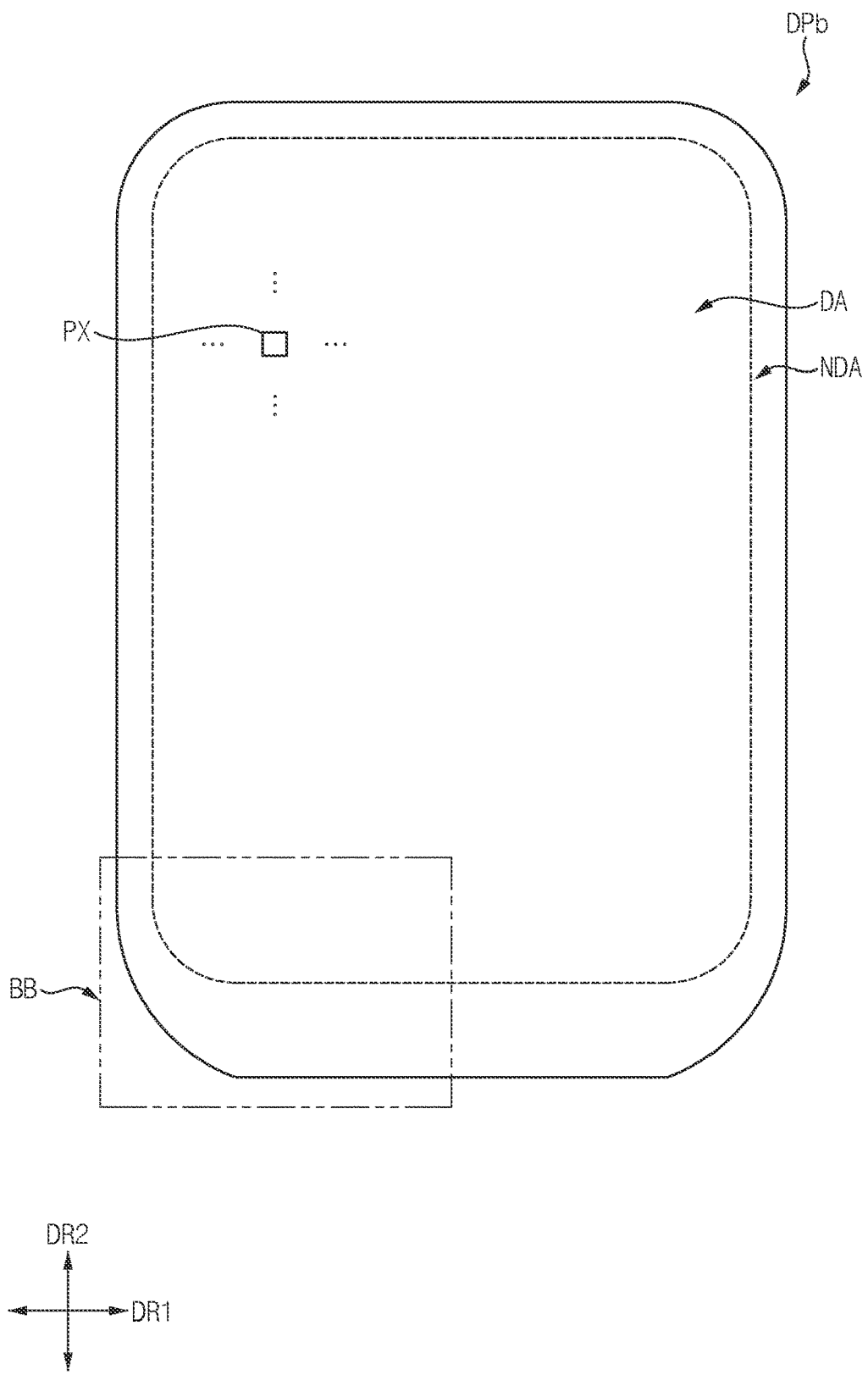
FIG. 18 is a plan view illustrating a display panel according to an alternative embodiment.

FIG. 18 is a plan view illustrating a display panel according to an alternative embodiment.

Referring to FIG. 18, a display panel DPb according to an embodiment may include a display area DA and a peripheral area NDA.

A pixel PX may be disposed in the display area DA. The pixel PX may be provided in plural in the display area DA, and the pixels PX may emit light. As shown in FIG. 18, the display area DA may include a round-type edge.

A peripheral area NDA may be disposed adjacent at least one side of the display area DA. Lines, electrodes, and/or driving circuits for driving the pixel PX may be disposed in the peripheral area NDA.

FIG. 19, FIG. 20, FIG. 21, and FIG. 22 are enlarged plan views of an area BB of FIG. 18.

Figure 19:
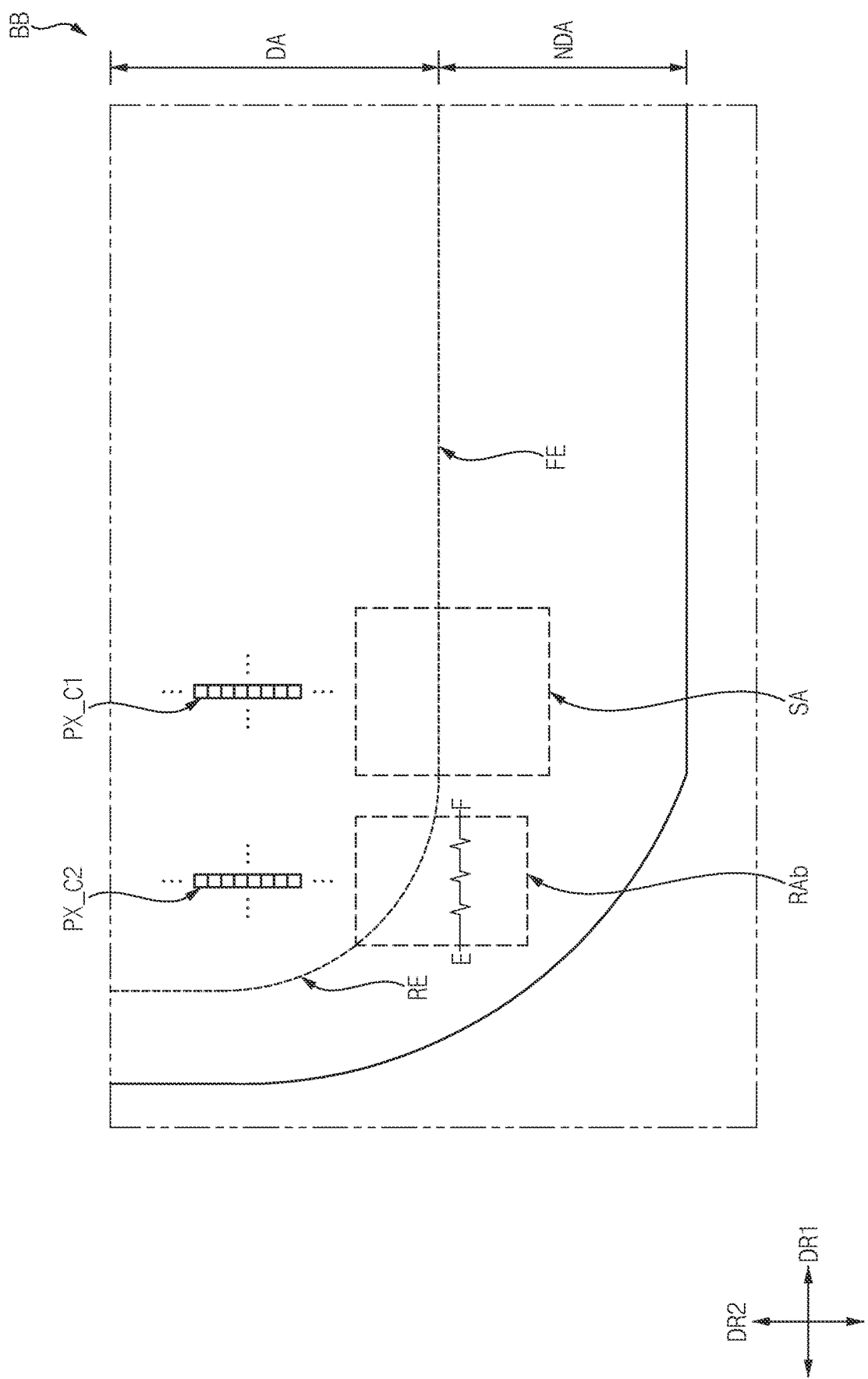
FIG. 19, FIG. 20, FIG. 21, and FIG. 22 are plan views enlarging an area BB of FIG. 18.

Referring to FIG. 19, in the area BB of FIG. 18, the display area DA may include a round-type edge RE and a flat-type edge FE extending from the round-type edge RE.

In an embodiment, a portion of the display area DA adjacent to the round-type edge RE and a portion of the peripheral area NDA adjacent to the round-type edge RE may be referred to as a round area RAb, and a portion of the display area DA adjacent to the flat-type edge FE and a portion of the peripheral area NDA adjacent to the flat-type edge FE may be referred to as a flat area SA.

The pixels PX may be generally disposed in the display area DA. In an embodiment, the pixels PX arranged along the second direction DR2 in the display area DA adjacent to the flat-type edge FE may be defined as a first pixel column PX_C1, and pixels PX arranged along the second direction DR2 in the display area adjacent to the round-type edge RE may be defined as a second pixel column PX_C2.

Figure 20:
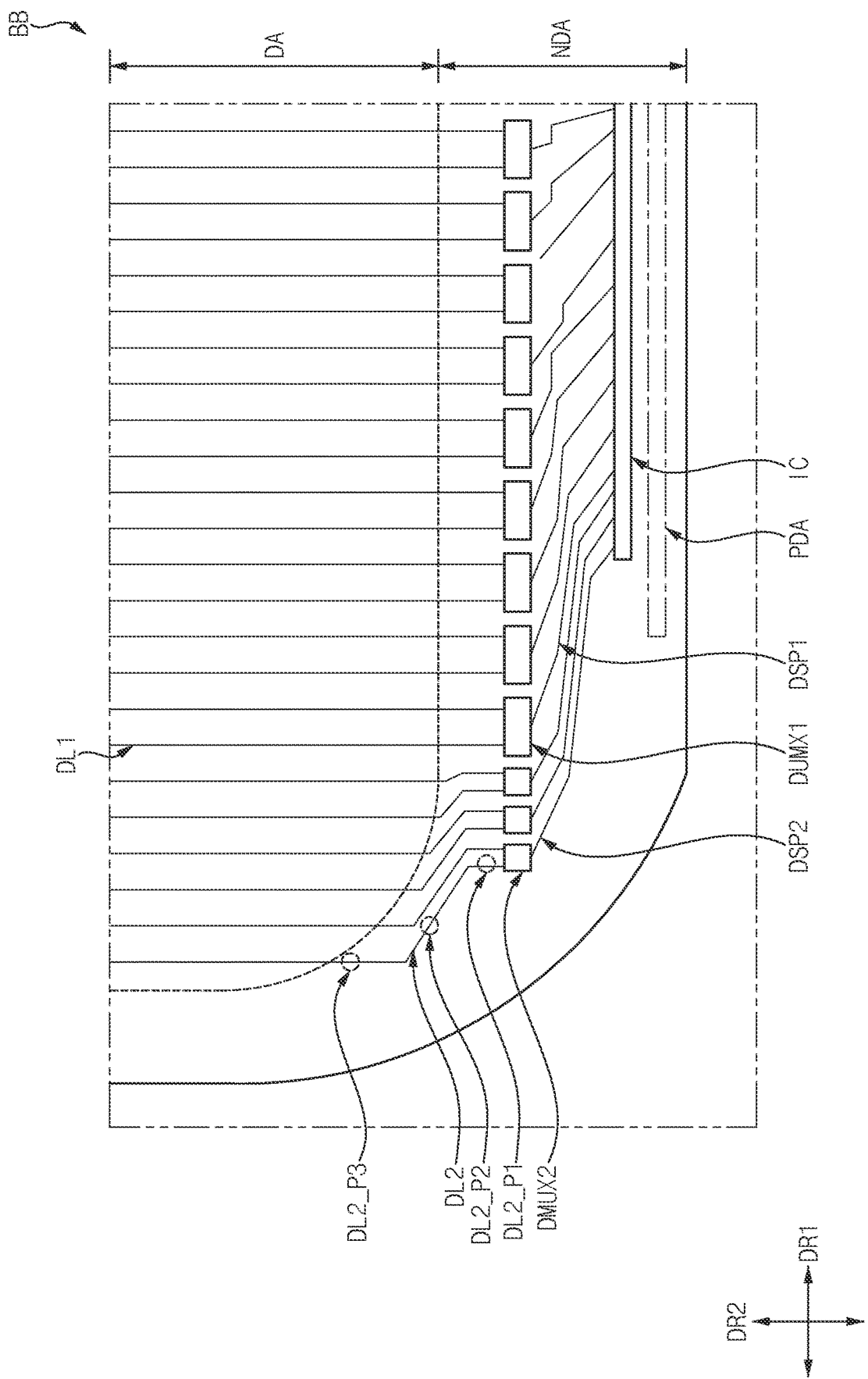

Referring to FIG. 19 and FIG. 20, various components for providing a data signal (refer to DATA of FIG. 6) to the pixel PX in the display area DA may be disposed in the peripheral area NDA. In an embodiment, a first demultiplexer unit DMUX1, a second demultiplexer unit DMUX2, and a driving chip IC may be disposed in the peripheral area NDA.

The driving chip IC may be electrically connected to pad electrodes disposed in a pad area PDA. In such an embodiment, the driving chip IC may receive the data signal from the pad electrodes, or may generate the data signal.

The first demultiplexer unit DMUX1 and the second demultiplexer unit DMUX2 may be electrically connected to the driving chip IC though a first data spider line DSP1 and a second data spider line DSP2. Each of the first demultiplexer unit DMUX1 and the second demultiplexer unit DMUX2 may receive the data signal from the driving chip IC. In addition, each of the first demultiplexer unit DMUX1 and the second demultiplexer unit DMUX2 may serve to demux the data signal.

The first demultiplexer unit DMUX1 may provide the data signal to the pixels PX included in the first pixel column PX_C1 through a first data line DL1. The second demultiplexer unit DMUX2 may provide the data signal to the pixels PX included in the second pixel column PX_C2 through a second data line DL2.

In an embodiment, each of the first pixel column PX_C1, the second pixel column PX_C2, the first data line DL1, and the second data line DL2 may be provided in plural. In an embodiment, the first pixel columns PX_C1 may be correspond to the first data lines DL1 in one-to-one correspondence, and the second pixel columns PX_C2 may be correspond to the second data lines DL2 in one-to-one correspondence. In such an embodiment, the pixels PX included in one of the first pixel columns PX_C1 may share one of the first data lines DL1. In addition, the pixels PX included in one of the second pixel columns PX_C2 may share one of the second data lines DL2.

Figure 21:
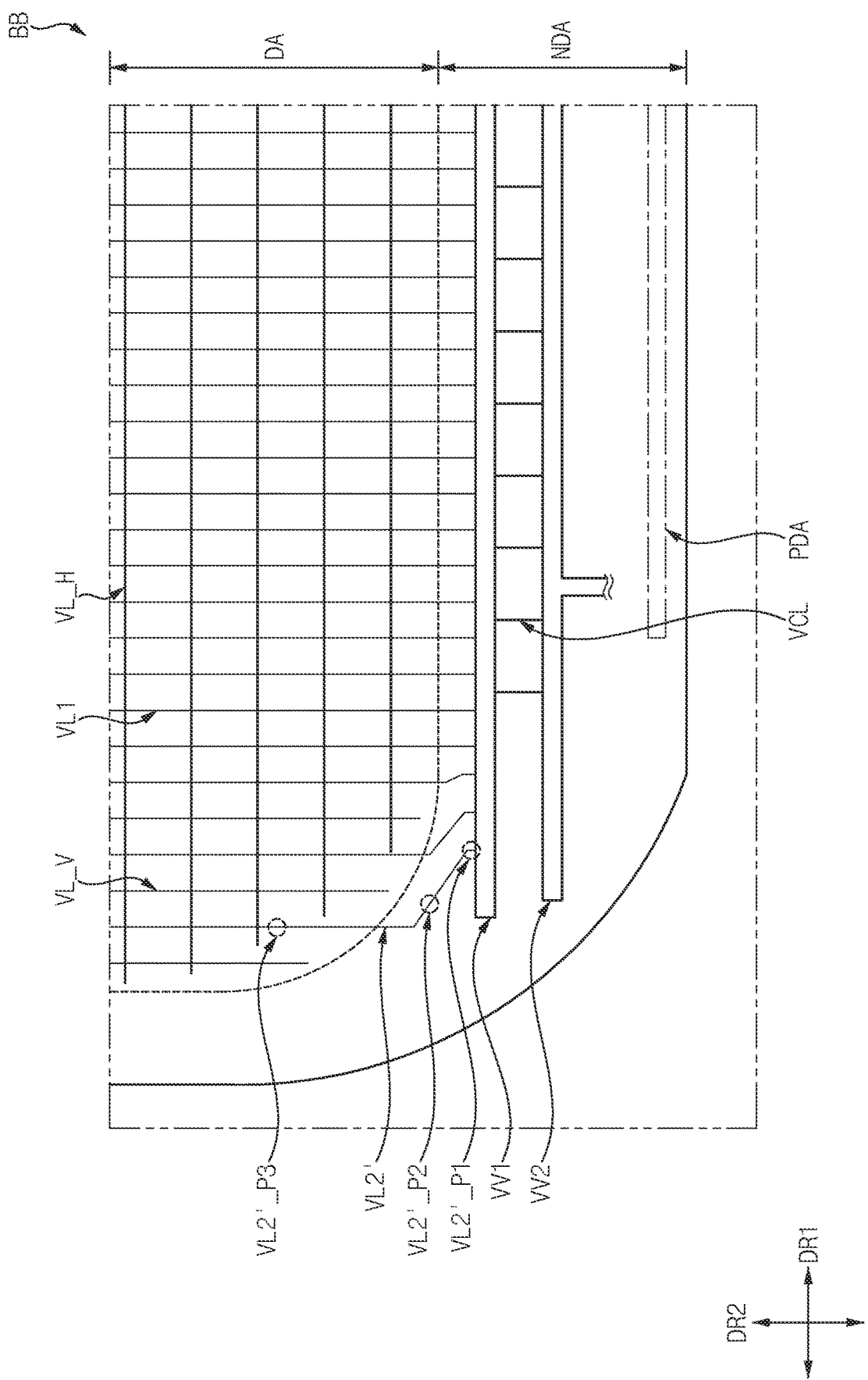

Referring to FIG. 19 and FIG. 21, various components for providing a constant voltage signal (refer to ELVDD of FIG. 6) to the pixel PX disposed in the display area DA may be disposed in the peripheral area NDA. In an embodiment, a first constant voltage transfer electrode VV1 and a second constant voltage transfer electrode VV2 may be disposed in the peripheral area NDA.

The second constant voltage transfer electrode VV2 may be electrically connected to pad electrodes disposed in the pad area PDA. In an embodiment, the second constant voltage transfer electrode VV2 may receive the constant voltage signal from the pad electrodes.

The first constant voltage transfer electrode VV1 may be disposed to closer to the display area DA than the second constant voltage transfer electrode VV2 is. A constant voltage bridge electrode VCL may electrically connect the first constant voltage transfer electrode VV1 and the second constant voltage transfer electrode VV2. Accordingly, the first constant voltage transfer electrode VV1 may receive the constant voltage signal from the second constant voltage transfer electrode VV2.

The first constant voltage transfer electrode VV1 may provide the constant voltage signal to the pixel PX disposed in the display area DA. In an embodiment, the first constant voltage transfer electrode VV1 may provide the constant voltage signal to the pixel PX through a first constant voltage transfer line VL1, a second constant voltage transfer line VL2', a vertical transfer line VL_V, and a horizontal transfer line VL_H.

The first constant voltage transfer line VL1 may be defined as a line electrically connected to the first constant voltage transfer electrode VV1 in the peripheral area NDA and extending from the peripheral area NDA to the display area DA via the flat-type edge FE. In an embodiment, as shown in FIG. 21, the first constant voltage transfer line VL1 may extend in the second direction DR2 in the peripheral area NDA and the display area DA.

The second constant voltage transfer line VL2' may be defined as a line electrically connected to the first constant voltage transfer electrode VV1 in the peripheral area NDA and extending from the peripheral area NDA to the display area DA via the round-type edge RE.

In an embodiment, the second constant voltage transfer line VL2' may include a first portion VL2'_P1, a second portion VL2'_P2, and a third portion VL2'_P3. The first portion VL2'_P1 of the second constant voltage transfer line VL2' may be electrically connected to the first constant voltage transfer electrode VV1 in the peripheral area NDA and may extend in the second direction DR2. The second portion VL2'_P2 of the second voltage transfer line VL2' may extend from the first portion VL2'_P1 of the second constant voltage transfer line VL2' in a direction crossing each of the first and second directions DR1 and DR2 in the peripheral area NDA. The third portion VL2'_P3 of the second voltage transfer line VL2' may extend from the second portion VL2'_P2 of the second voltage transfer line VL2' to the display area DA via the round-type edge RE. The third portion VL2'_P3 may extend in the second direction DR2 from the second portion VL2' 2.

The vertical transfer line VL_V may be disposed adjacent to the second constant voltage transfer line VL2' in the display area DA adjacent to the round-type edge RE. In an embodiment, as shown in FIG. 21, the vertical transfer line VL_V may not be disposed in the peripheral area NDA. In an embodiment, the vertical transfer line VL_V may extend in a same direction as an extending direction of the third portion VL2'_P3 of the second constant voltage transfer line VL2' in the display area DA.

The horizontal transfer line VL_H may extend in the first direction DR1 in the display area DA. The horizontal transfer line VL_H may be electrically connected to each of the first constant voltage transfer line VL1, the second constant voltage transfer line VL2, and the vertical transfer line VL_V.

The first constant voltage transfer electrode VV1 may provide the constant voltage signal to the pixels PX included in the first pixel column PX_C1 through the first constant voltage transfer line VL1.

In an embodiment, the pixels PX included in the second pixel column PX_C2 may receive the constant voltage signal from the second constant voltage transfer line VL2' or from the vertical transfer line VL_V. In such an embodiment, the pixels PX included in some of the second pixel columns PX_C2 may receive the constant voltage signal from the first constant voltage transfer electrode VV1 through the second constant voltage transfer line VL2', and the pixels PX included in others of the second pixel columns PX_C2 may receive the constant voltage signal from the first constant voltage transfer electrode VV1 through the vertical transfer line VL_V electrically connected to each of the first and second constant voltage transfer lines VL1 and VL2' through the horizontal transfer line VL_H.

In an embodiment, each of the first pixel column PX_C1, the second pixel column PX_C2, the first constant voltage transfer line VL1, the second constant voltage transfer line VL2', the vertical transfer line VL_V, and the horizontal transfer line VL_H may be provided in plural.

The first pixel columns PX_C1 may be correspond to the first constant voltage transfer lines VL1 in one-to-one correspondence. In an embodiment, the pixels PX included in one of the first pixel columns PX_C1 may share one of the first constant voltage transfer lines VL1.

Unlike the second constant voltage transfer line VL2 (shown in FIG. 4), the second pixel columns PX_C2 may not have one-to-one correspondence with the second constant voltage transfer lines VL2'. In such an embodiment, the number of the second pixel columns PX_C2 may be the same as the sum of the number of the second constant voltage transfer lines VL2' and the number of the vertical transfer lines VL_V. In such an embodiment, the pixels PX included in one of the second pixel columns PX_C2 may share one of the second constant voltage transfer line VL2' or one of the vertical transfer lines VL_V.

The pixels PX included in the second pixel column PX_C2 and sharing one of the second constant voltage transfer lines VL2' may receive the constant voltage signal through the second constant voltage transfer line VL2'.

The pixels PX included in the second pixel column PX_C2 and sharing one of the vertical transfer lines VL_V may receive the constant voltage signal through the vertical transfer lines VL_V. In an embodiment, the vertical transfer line VL_V may receive the constant voltage signal from the first constant voltage transfer line VL1 or the second constant voltage transfer line VL2' through the horizontal transfer line VL_H.

In an embodiment, as described above, the number of the second constant voltage transfer lines VL2' included in the display panel DPb may be less than the number of the second constant voltage transfer lines VL2 included in the display panel DPa. Accordingly, an area in which the second constant voltage transfer lines VL2' are disposed in the peripheral area NDA adjacent to the round-type edge RE may be smaller (or less) than an area in which the second constant voltage transfer lines VL2 are disposed in the peripheral area NDA adjacent to the round-type edge RE. Accordingly, in such an embodiment, an area of the peripheral area NDA adjacent to the round-type edge RE may be further reduced in the display panel DPb.

In an embodiment, as shown in FIG. 21, the vertical transfer line VL_V may be sufficiently adjacent to the second constant voltage transfer line VL2', and may be electrically connected to the adjacent second constant voltage transfer line VL2' through the horizontal transfer line VL_H. Accordingly, the pixels PX included in the second pixel column PX_C2 and sharing one vertical transfer line VL_V may receive sufficient amount of the constant voltage signal from the vertical transfer line VL_V, and accordingly, luminance drop may not occur.

In an embodiment, the horizontal transfer lines VL_H may cross the first constant voltage transfer lines VL1, the second constant voltage transfer lines VL2', and the vertical transfer lines VL_V to form a mesh shape.

Figure 22:
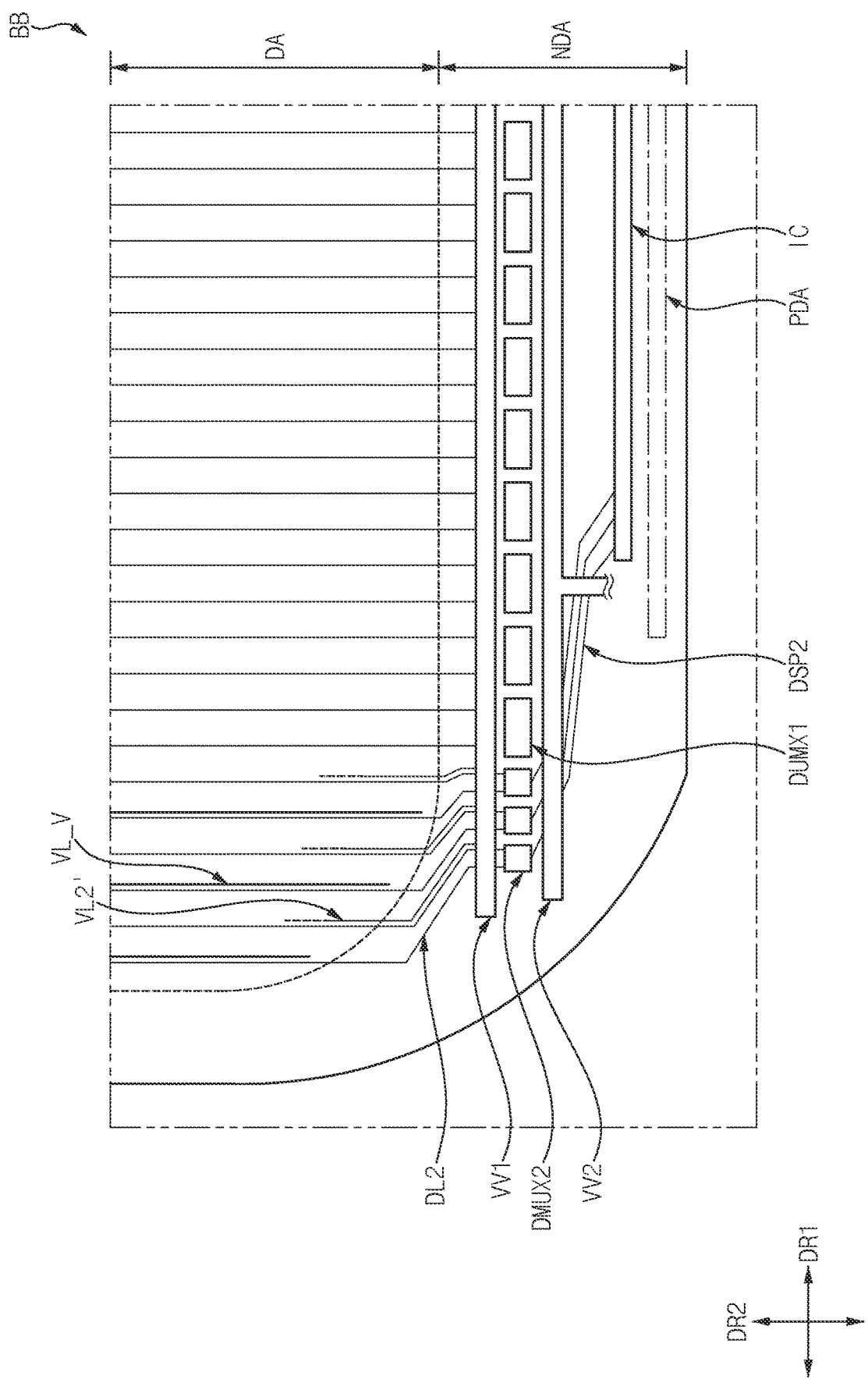

Referring to FIG. 19 and FIG. 22, the various components (refer to FIG. 20) for providing the data signal to the pixel PX disposed in the display area DA and the various components (refer to FIG. 21) for providing the constant voltage signal to the pixel PX disposed in the display area DA may be disposed in the peripheral area NDA at the same time.

In FIG. 22, for convenience of illustration and description, the first data line DL1 described with reference to FIG. 20 is not shown, and the first constant voltage transfer line VL1, the horizontal transfer line VL_H, and the constant voltage bridge electrode VCL described with reference to FIG. 21 are not shown.

In an embodiment, each of the second data line DL2, the second constant voltage transfer line VL2', and the vertical transfer line VL_V may be provided in plural. In such an embodiment, the number of the second data lines DL2 may be the same as the sum of the number of the second constant voltage transfer lines VL2' and the number of the vertical transfer lines VL_V.

In an embodiment, the pixels PX included in the second pixel column PX_C2 disposed adjacent to the round-type edge RE may share one second data line DL2 and one second constant voltage transfer line VL2', or may share one second data line DL2 and one vertical transfer line VL_V.

Accordingly, in the display panel DPb according to an embodiment, the pixels PX included in one second pixel column PX_C2 may receive the data signal from one second data line DL2, and at the same time, the pixels PX included in one second pixel column PX_C2 may receive the constant voltage signal from one second constant voltage transfer line VL2' or from the one vertical transfer line VL_V.

In an embodiment, the pixels PX included in one second pixel column PX_C2 may directly receive the constant voltage signal from one second constant voltage transfer line VL2'. Accordingly, luminance drop that occurs when the constant voltage signal is not substantially transmitted to the pixels PX (or is relatively less transmitted to the pixels PX) included in the second pixel column PX_C2 may be effectively prevented.

In an embodiment, the pixels PX included in one second pixel column PX_C2 may receive the constant voltage signal from one vertical transfer line VL_V electrically connected to the second constant voltage transfer line VL2' through the horizontal transfer line VL_H. In such an embodiment, as described above, the second constant voltage transfer line VL2' may be disposed to sufficiently adjacent to the vertical transfer line VL_V. Accordingly, the pixels PX included in the second pixel column PX_C2 and sharing the vertical transfer line VL_V may receive sufficient amount of the constant voltage signal though the vertical transfer line VL_V.

In a case where the second constant voltage transfer line VL2' does not exist, the pixels PX included in the second pixel column PX_C2 may receive the constant voltage signal from the horizontal transfer line VL_H, or may receive the constant voltage signal from the vertical transfer line VL_V electrically connected to the first constant voltage transfer line VL1 through the horizontal transfer line VL_H. In this case, the constant voltage may not be substantially transmitted to the pixels PX (or may be relatively less transmitted to the pixels PX) included in the second pixel column PX_C2, and accordingly, a luminance drop in the pixels PX included in the second pixel column PX_C2 may occur.

In FIG. 22, an embodiment where the number of the second constant voltage transfer lines VL2' is the same as the number of the vertical transfer lines VL_V, and the second constant voltage transfer lines VL2' and the vertical transfer lines VL_V are alternately arranged is shown, but the invention is not limited thereto. In an alternative embodiment, for example, the number of the second constant voltage transfer lines VL2' may be different from the number of the vertical transfer lines VL_V. In addition, the second constant voltage transfer lines VL2' and the vertical transfer lines VL_V may be arranged in various ways.

In another alternative embodiment, for example, unlink shown in FIG. 21 and FIG. 22, the vertical transfer line VL_V may be omitted, and in this case, the number of the second data lines DL2 may be greater than the number of the second constant voltage transfer lines VL2'.

In such an embodiment where the vertical transfer line VL_V is omitted, the pixels PX included in the second pixel column PX_C2 may directly receive the constant voltage signal from the second constant voltage transfer line VL2', or may receive the constant voltage signal from the horizontal transfer line VL_H electrically connected to adjacent second constant voltage transfer line VL2'.

When the pixels PX included in the second pixel column PX_C2 directly receive the constant voltage signal from the second constant voltage transfer line VL2', a sufficient amount of the constant voltage signal may be provided to the pixels PX. Accordingly, luminance drop may not occur.

When the pixels PX included in the second pixel column PX_C2 receive the constant voltage signal from the horizontal transfer line VL_H electrically connected to adjacent second constant voltage transfer line VL2', a sufficient amount of the constant voltage signal may be provided to the pixels PX from adjacent second constant voltage transfer line VL2'. Accordingly, luminance drop may not occur.

In another alternative embodiment, unlike shown in FIG. 21 and FIG. 22, the number of the second data lines DL2 may be greater than sum of the number of the second constant voltage transfer lines VL2' and the number of the vertical transfer lines VL_V.

In such an embodiment, the pixels PX included in the second pixel column PX_C2 may directly receive the constant voltage signal from the second constant voltage transfer line VL2', or may receive the constant voltage signal from the horizontal transfer line VL_H electrically connected to adjacent second constant voltage transfer line VL2', or may receive the constant voltage signal from the vertical transfer line VL_V electrically connected to adjacent second constant voltage transfer line VL2' through the horizontal transfer line VL_H.

In an embodiment, to reduce a planar area of the peripheral area NDA, the first demultiplexer unit DMUX1 and the second demultiplexer unit DMUX2 may be disposed between the first constant voltage transfer electrode VV1 and the second constant voltage transfer electrode VV2.

Accordingly, the first constant voltage transfer electrode VV1 may overlap the second data line DL2 in a plan view. In such an embodiment, the first constant voltage transfer electrode VV1 and the second data lien DL2 are desired to be electrically insulated from each other so that the constant voltage signal and the data signal do not interfere with each other. Accordingly, in such an embodiment, at least a portion of the second data line DL2 overlapping the first constant voltage transfer electrode VV1 in a plan view may be disposed in a different layer from a layer in which the first constant voltage transfer electrode VV1 is disposed.

In addition, the second constant voltage transfer electrode VV2 may overlap the second data spider line DSP2 in a plan view. In such an embodiment, the second constant voltage transfer electrode VV2 and the second data spider line DSP2 are desired to be electrically insulated from each other so that the constant voltage and the data signal do not interfere with each other. Accordingly, in such an embodiment, at least a portion of the second data spider line DSP2 overlapping the second constant voltage transfer electrode VV2 in a plan view may be disposed in a different layer from a layer in which the second constant voltage transfer electrode VV2 is disposed.

Similarly, although not shown in FIG. 22, the first constant voltage transfer electrode VV1 may overlap the first data line DL1 in a plan view, and the second constant voltage transfer electrode VV2 may overlap the first data spider line DSP1. In such an embodiment, at least a portion of the first data line DL1 overlapping the first constant voltage transfer electrode VV1 may be disposed in a different layer from the layer in which the first constant voltage transfer electrode VV1 is disposed, and at least a portion of the first data spider line DSP1 overlapping the second constant voltage transfer electrode VV2 may be disposed in a different layer from the layer in which the second constant voltage transfer electrode VV2 disposed.

Figure 23:
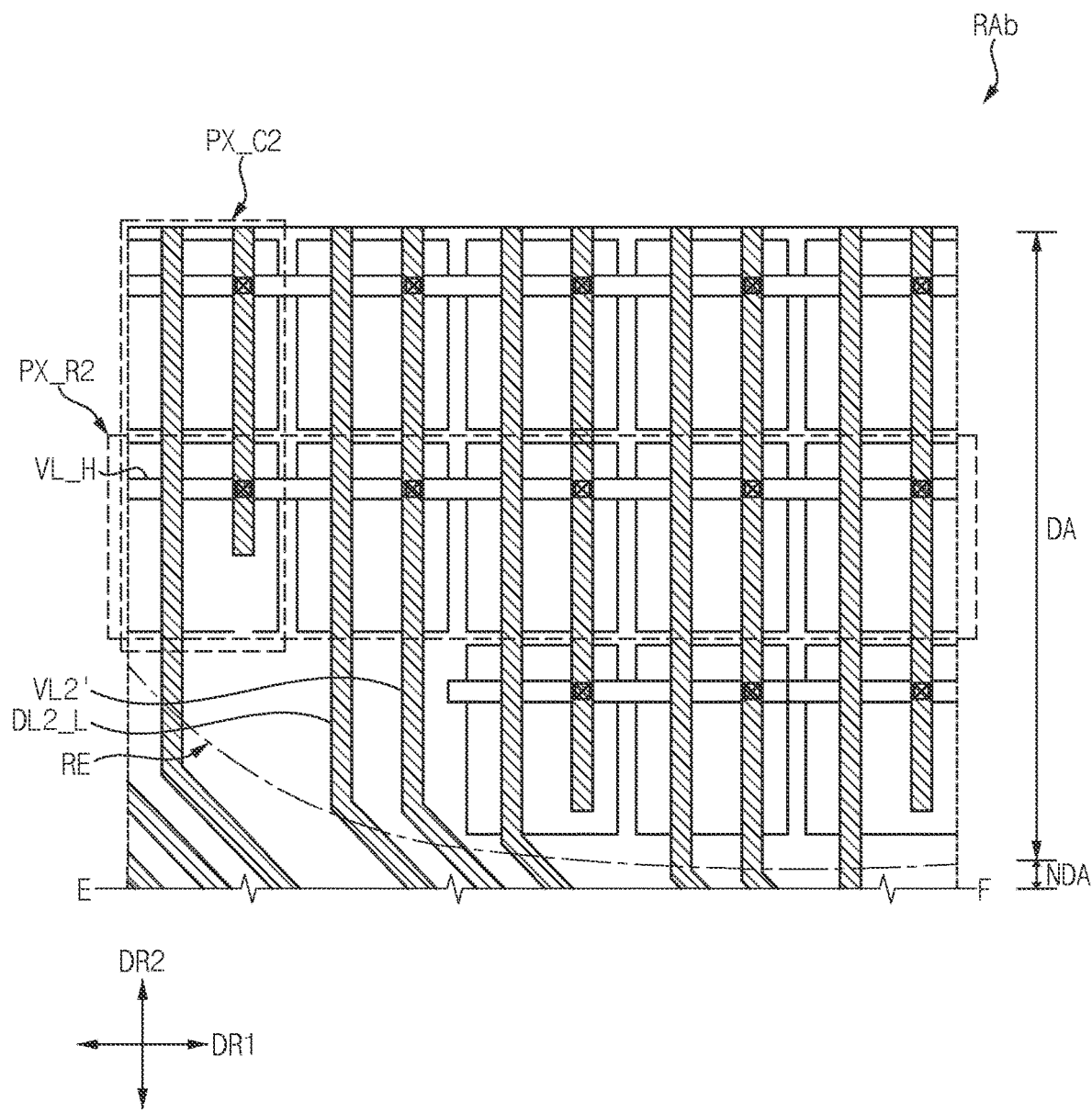
FIG. 23 and FIG. 24 are enlarged plan views of a round area of FIG. 19.
Figure 24:
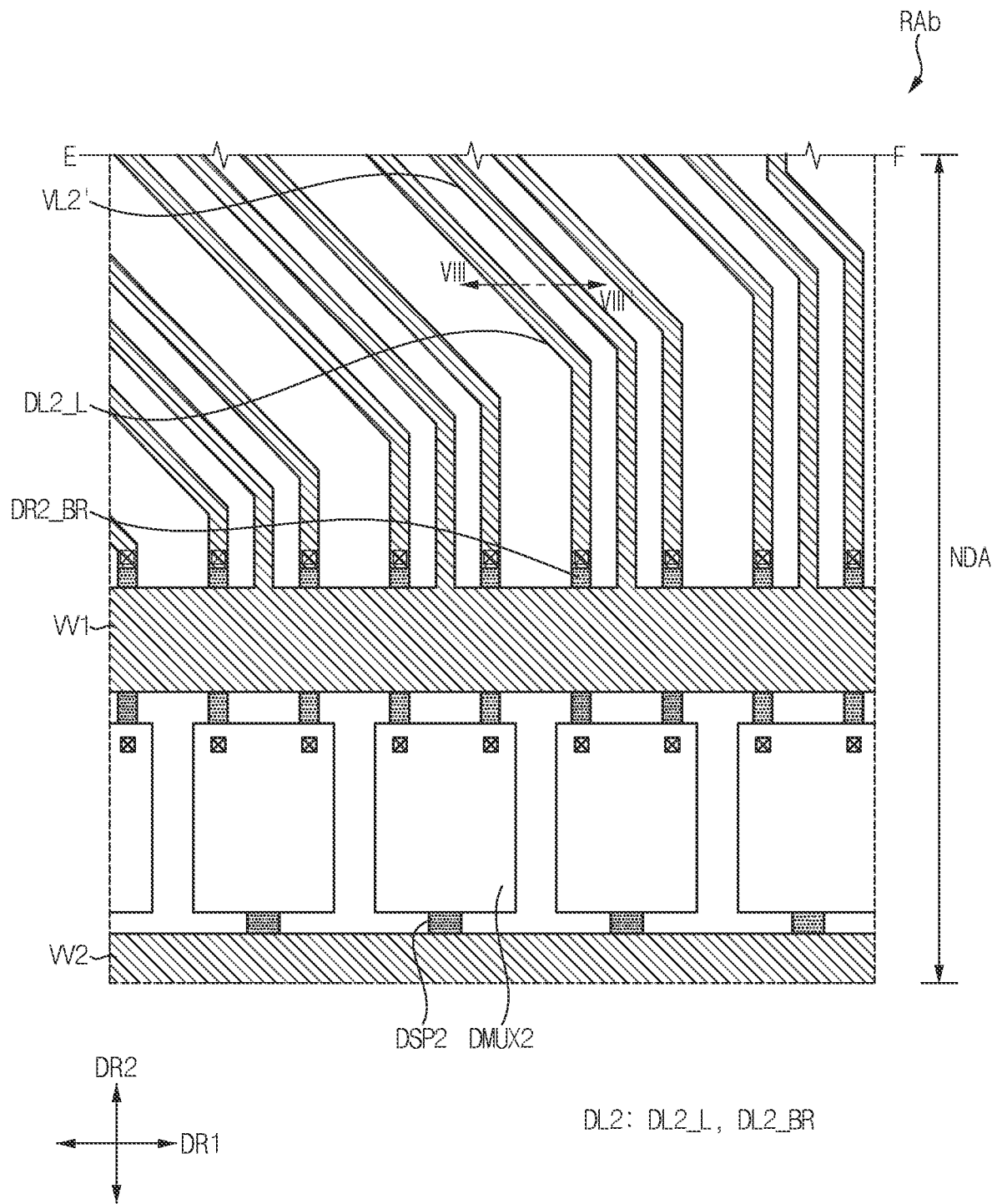
Figure 25:
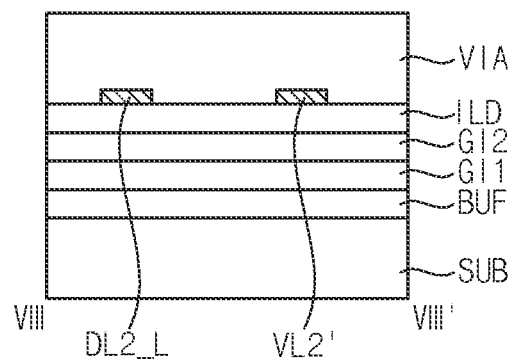
FIG. 25 is a cross-sectional view taken along line VIII-VIII' of FIG. 24.

FIG. 23 and FIG. 24 are enlarged plan views of a round area of FIG. 19. FIG. 25 is a cross-sectional view taken along line VIII-VIII' of FIG. 24. Particularly, FIG. 23 is an enlarged plan view of an upper portion of line E-F of FIG. 19 in the round area RAb, and FIG. 24 is an enlarged plan view of a lower portion of line E-F of FIG. 19 in the round area RAb.

Referring to FIG. 23 and FIG. 24, the pixel PX may be disposed in the display area DA adjacent to the round-type edge RE. In an embodiment, the pixel PX may be provided in plural, and a part of the pixels PX may be arranged in a stepwise manner along the round-type edge RE.

In the display area DA adjacent to the round-type edge RE, the pixels PX arranged along the second direction DR2 may be defined as the second pixel column PX_C2, and the pixels PX arranged along the first direction DR1 may be defined as a second pixel row PX_R2. In an embodiment, each of the second pixel column PX_C2 and the second pixel row PX_R2 may be provided in plural in the display area DA.

In an embodiment, as shown in FIG. 24, the second constant voltage transfer line VL2' may be integrally formed with the first constant voltage transfer electrode VV1 as a single unitary and indivisible part. In such an embodiment, the second constant voltage transfer line VL2' may be defined as a line branching from and extend from the first constant voltage transfer electrode VV1.

In an embodiment, the second constant voltage transfer line VL2' may extend to the display area DA via the round-type edge RE. In such an embodiment, a portion of the second constant voltage transfer line VL2' branching from the first constant voltage transfer electrode VV1 may be spaced apart from a portion of the second constant voltage transfer line VL2' disposed in the display area DA in the first direction DR1.

The second data line DL2 may include a second bridge line DL2_BR and a second data transfer line DL2_L.

The second bridge line DL2_BR may be electrically connected to the second demultiplexer unit DMUX2 in the peripheral area NDA. The second bridge line DL2_BR may overlap the first constant voltage transfer electrode VV1 in a plan view. In an embodiment, the second bridge line DL2_BR may be electrically insulated from the first constant voltage transfer electrode VV1. In such an embodiment, the second bridge line DL2_BR may be disposed in a different layer from a layer in which the first constant voltage transfer electrode VV1 is disposed.

The second data transfer line DL2_L may be electrically connected to the second bridge line DL2_BR in the peripheral area NDA. Accordingly, the second data transfer line DL2_L may receive the data signal from the second demultiplexer unit DMUX2 through the second bridge line DL2_BR. In an embodiment, the second data transfer line DL2_L may extend to the display area DA via the round-type edge. In such an embodiment, a portion of the second data transfer line DL2_L connected to the second bridge line DL2_BR may be spaced apart from a portion of the second data transfer line DL2_L disposed in the display area DA in the first direction DR1.

As shown in FIG. 23, the pixels PX included in one second pixel column PX_C2 may share one second constant voltage transfer line VL2' and one second data transfer line DL2_L, or may share one vertical transfer line VL_V and one second data transfer line DL2_L.

In an embodiment, the pixels PX included in one second pixel row PX_R2 may share one horizontal transfer line VL_H, and the horizontal transfer line VL_H may be electrically connected to each of the second constant voltage transfer line VL2' and the vertical transfer line VL_V, and may be electrically insulated from the second data transfer line DL2_L. Accordingly, in such an embodiment, the horizontal transfer line VL_H may be disposed on a different layer from a layer on which the second constant voltage transfer line VL2' is disposed, and from a layer on which the second vertical transfer line VL_V is disposed, and from a layer on which the second data transfer line DL2_L is disposed.

In an embodiment, for example, the horizontal transfer line VL_H may be disposed in a same layer (for example, on the first gate insulation layer GI1) as a layer in which the first gate electrode GE1 (shown in FIG. 7) is disposed, and each of the second constant voltage transfer line VL2', the vertical transfer line VL_V, and the second data transfer line DL2_L may be disposed in a same layer (for example, on the interlayer insulation layer ILD) as a layer in which the first and second source-drain electrodes SD1 and SD2 (shown in FIG. 7) are disposed. In such an embodiment, each of the second voltage transfer line VL2' and the vertical transfer line VL_V may electrically contact the horizontal transfer line VL_H through a penetrating hole defined through the interlayer insulation layer ILD and the second gate insulation layer GI2.

In an alternative embodiment, for example, the horizontal transfer line VL_H may be disposed in a same layer (for example, on the second gate insulation layer GI2) as a layer in which the second gate electrode GE2 (shown in FIG. 7) is disposed, and each of the second constant voltage transfer line VL2', the vertical transfer line VL_V, and the second data transfer line DL2_L may be disposed in a same layer (for example, on the interlayer insulation layer ILD) as a layer in which the first and second source-drain electrodes SD1 and SD2 (shown in FIG. 7) are disposed. In such an embodiment, each of the second voltage transfer line VL2' and the vertical transfer line VL_V may electrically contact the horizontal transfer line VL_H through a penetrating hole defined through the interlayer insulation layer ILD.

Accordingly, in the display area DA adjacent to the round-type edge RE, the pixels PX may receive the constant voltage signal from the second constant voltage transfer line VL2', the vertical transfer line VL_V, and/or the horizontal transfer line VL_H, and may receive the data signal from the second data transfer line DL2_L.

Referring to FIG. 24 and FIG. 25, the second data transfer line DL2_L may be disposed in a same layer as a layer in which the second constant voltage transfer line VL2' is disposed. In an embodiment, each of the second data transfer line DL2_L and the second constant voltage transfer line VL2' may be disposed in a same layer (for example, on the interlayer insulation layer ILD) as a layer in which the first and second source-drain electrodes SD1 and SD2 (shown in FIG. 7) are disposed. In this case, the second data transfer line DL2_L may be disposed to space apart from the second constant voltage transfer line VL2', and accordingly, the second data transfer line DL2_L may be electrically insulated from the second constant voltage transfer line VL2'.

Hereinafter, a display panel according to another alternative embodiment may be described with reference to FIGS. 26 to 30. Hereinafter, any repetitive detailed description of components substantially same as (or similar to) the components described with reference to FIGS. 1 to 17 will be omitted, and same (or similar) reference sings may be used for components that are substantially same as (or similar to) the components described with reference to FIGS. 1 to 17.

Figure 26:
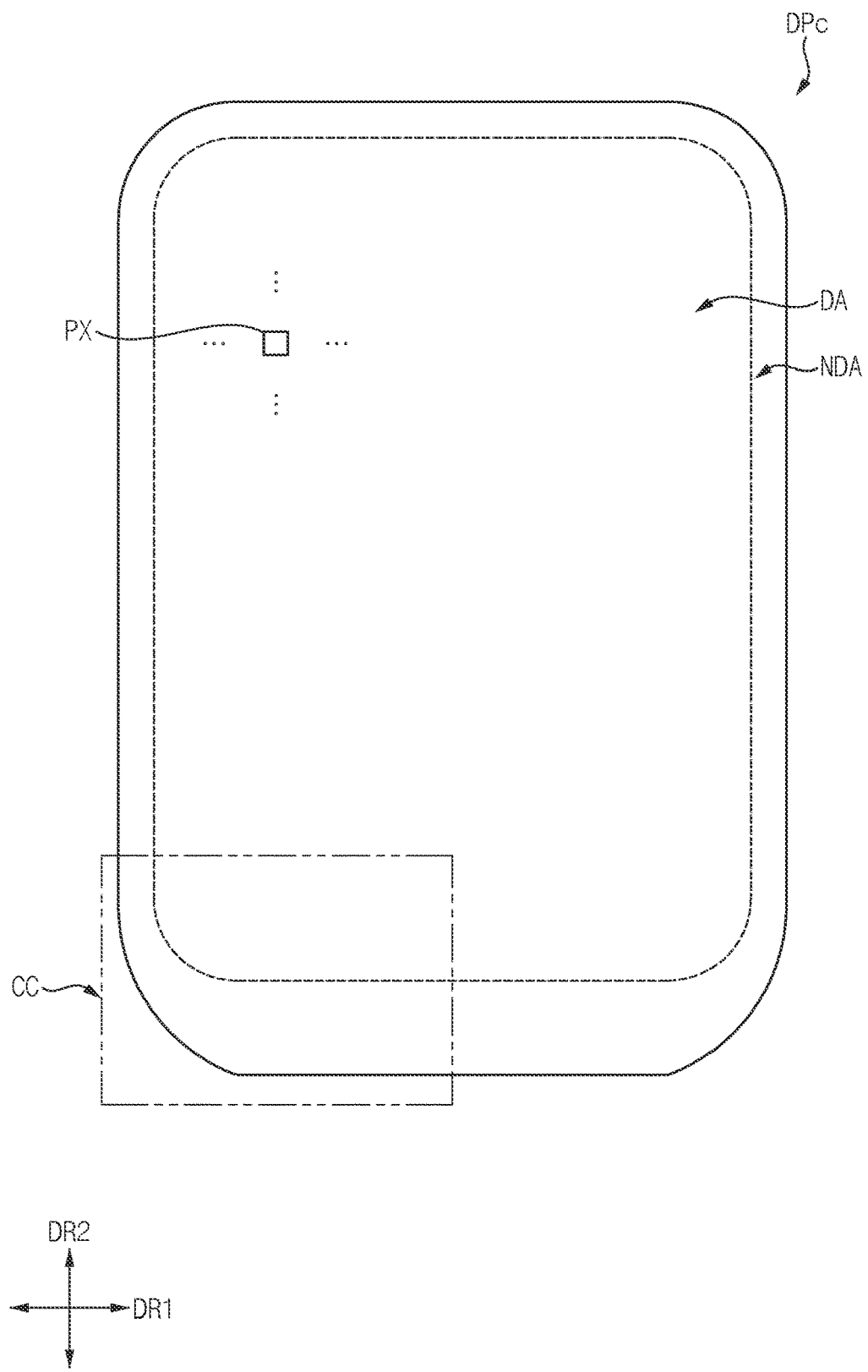
FIG. 26 is a plan view illustrating a display panel according to another alternative embodiment.

FIG. 26 is a plan view illustrating a display panel according to another alternative embodiment.

Referring to FIG. 26, a display panel DPc according to an embodiment may include a display area DA and a peripheral area NDA.

A pixel PX may be disposed in the display area DA. The pixel PX may be provided in plural in the display area DA, and the pixels PX may emit light. As shown in FIG. 26, the display area DA may include a round-type edge.

The peripheral area NDA may be disposed adjacent to at least one side of the display area DA. Lines, electrodes, and/or driving circuits for driving the pixel PX may be disposed in the peripheral area NDA.

FIG. 27, FIG. 28, FIG. 29, and FIG. 30 are enlarged plan views of an area CC of FIG. 26.

Figure 27:
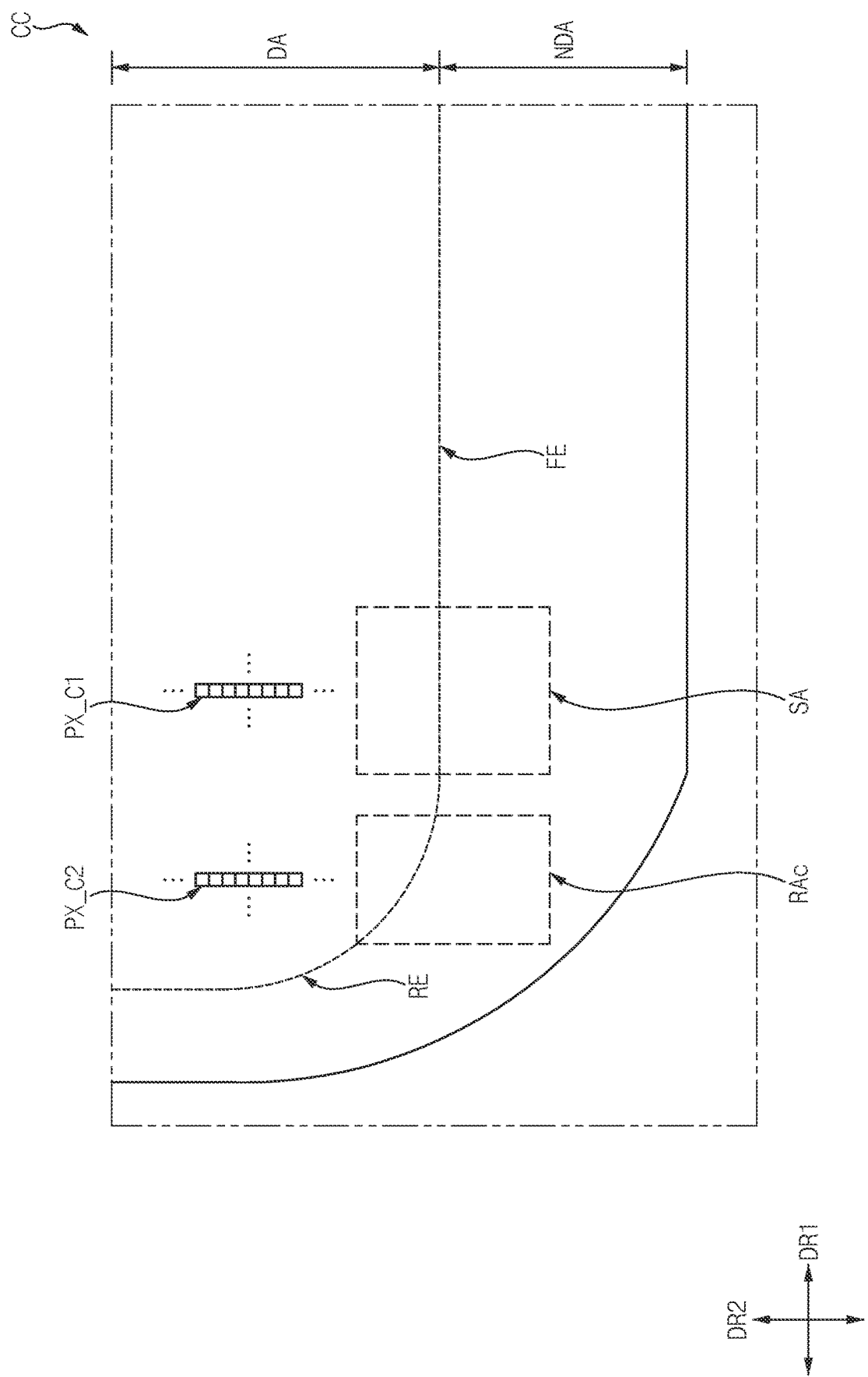
FIG. 27, FIG. 28, FIG. 29, and FIG. 30 are enlarged plan views of an area CC of FIG. 26.

Referring to FIG. 27, in an area CC of FIG. 6, the display area DA may include a round-type edge RE and a flat-type edge FE extending from the round-type edge RE.

In an embodiment, a portion of the display area DA adjacent to the round-type edge RE and a portion of the peripheral area NDA adjacent to the round-type edge RE may be referred to as a round area RAc, and a portion of the display area DA adjacent to the flat-type edge FE and a portion of the peripheral area NDA adjacent to the flat-type edge FE may be referred to as a flat area SA.

The pixels PX may be generally disposed in the display area DA. In an embodiment, the pixels PX arranged along the second direction DR2 in the display area DA adjacent to the flat-type edge FE may be defined as a first pixel column PX_C1, and the pixels PX arranged along the second direction DR2 in the display area DA adjacent to the round-type edge RE may be defined as a second pixel column PX_C2.

Figure 28:
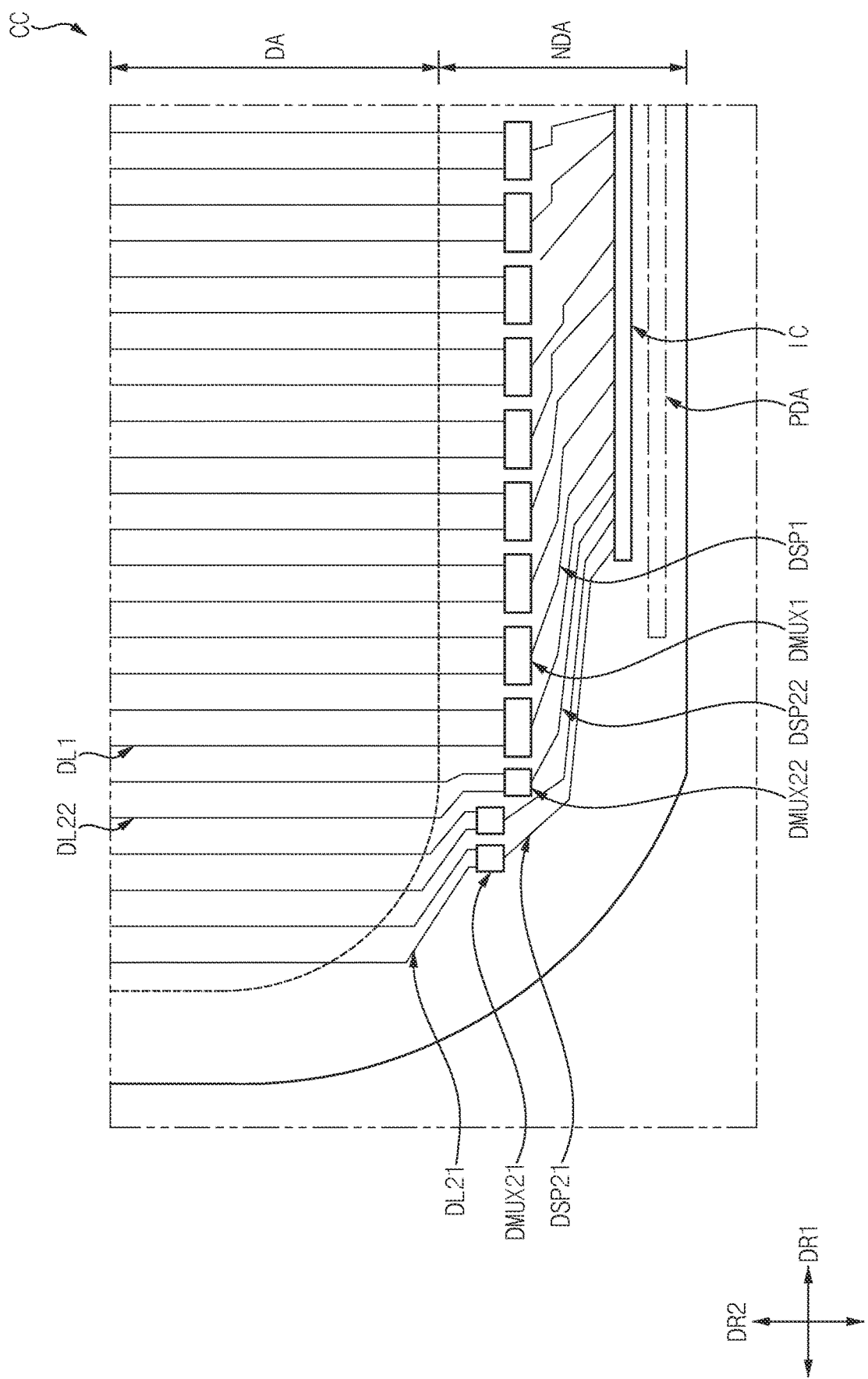

Referring to FIG. 27 and FIG. 28, various components for providing a data signal (refer to DATA of FIG. 6) to the pixel PX disposed in the display area DA may be disposed in the peripheral area NDA. In an embodiment, a first demultiplexer unit DMUX1, a second demultiplexer unit DMUX21, a third demultiplexer unit DMUX22, and a driving chip IC may be disposed in the peripheral area NDA.

The driving chip IC may be electrically connected to pad electrodes disposed in a pad area PDA. In an embodiment, the driving chip IC may receive the data signal from the pad electrodes, or may generate the data signal.

The first demultiplexer unit DMUX1, the second demultiplexer unit DMUX21, and the third demultiplexer unit DMUX22 may be electrically connected to the driving chip IC through a first data spider line DSP1, a second data spider line DSP21, and a third data spider line DSP22. Each of the first demultiplexer unit DMUX1, the second demultiplexer unit DMUX21, and the third demultiplexer unit DMUX22 may receive the data signal from the driving chip IC. In addition, each of the first demultiplexer unit DMUX1, the second demultiplexer unit DMUX21, and the third demultiplexer unit DMUX22 may serve to demux the data signal.

The first demultiplexer unit DMUX1 may provide the data signal to the pixels PX included in the first pixel column PX_C1 through a first data line DL1. The pixels PX included in the second pixel column PX_C2 may receive the data signal from the second demultiplexer unit DMUX21 through a second data line DL21, or from the third demultiplexer unit DMUX22 through a third data line DL22.

In an embodiment, the second demultiplexer unit DMUX21 may be disposed to space apart from the third demultiplexer unit DMUX22 in the first direction DR1 and the second direction DR2, and the third demultiplexer unit DMUX22 and the first demultiplexer unit DMUX1 may be arranged in the first direction DR1.

In an embodiment, the first pixel column PX_C1, the second pixel column PX_C2, the first data line DL1, the second data line DL21, and the third data line DL22 may be provided in plural. In an embodiment, the first pixel columns PX_C1 may be correspond to the first data lines DL1 in one-to-one correspondence. In addition, the number of the second pixel columns PX_C2 may be the same as the sum of the number of the second data lines DL21 and the number of the third data lines DL22.

Figure 29:
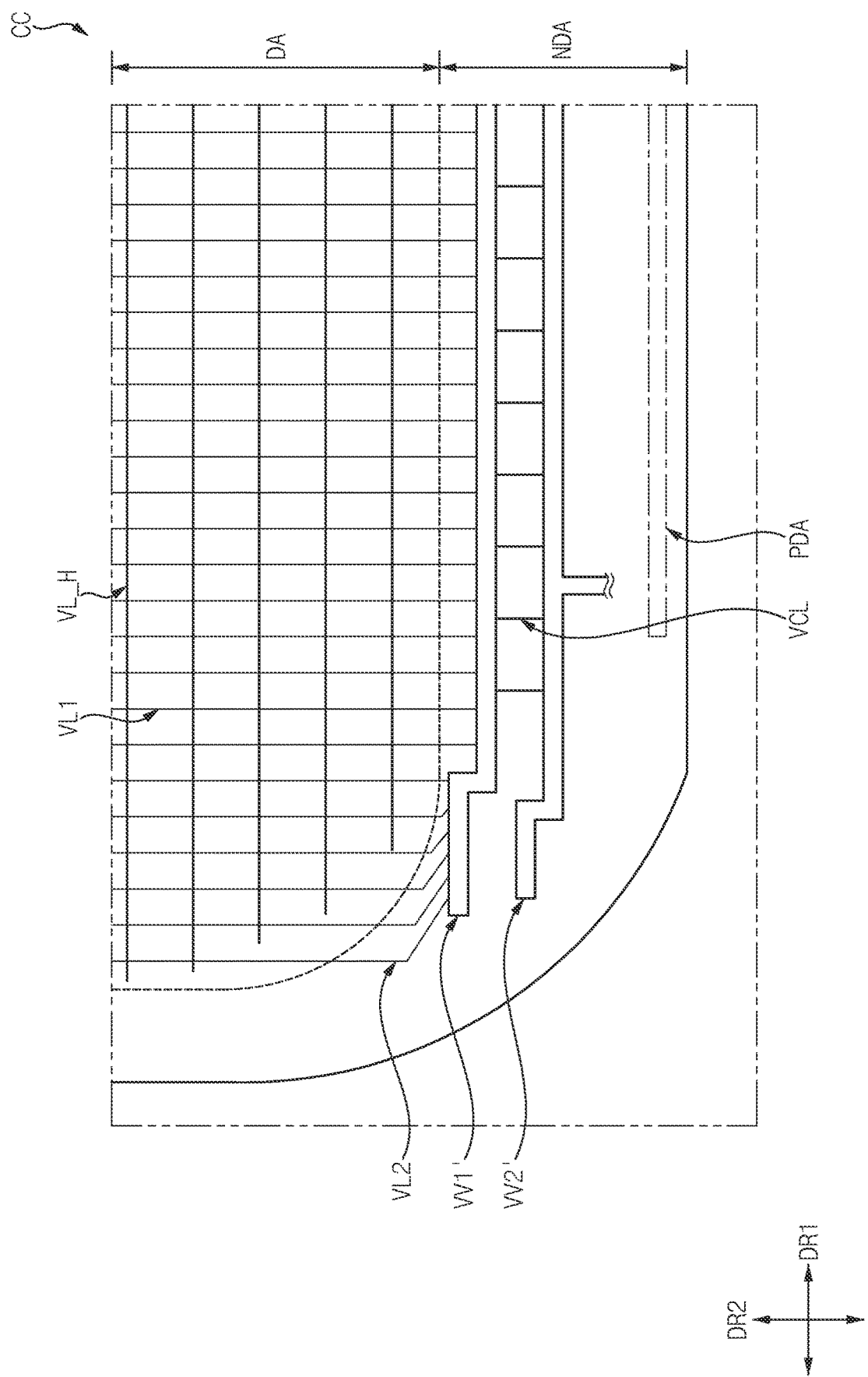

Referring to FIG. 27 and FIG. 29, various components for providing a constant voltage signal (refer to ELVDD of FIG. 6) to the pixel PX disposed in the display area DA may be disposed in the peripheral area NDA. In an embodiment, a first constant voltage transfer electrode VV1' and a second constant voltage transfer electrode VV2' may be disposed in the peripheral area NDA.

The second constant voltage transfer electrode VV2' may be electrically connected to pad electrodes disposed in the pad area PDA. In an embodiment, the second constant voltage transfer electrode VV2' may receive the constant voltage signal from the pad electrodes.

In an embodiment, as shown in FIG. 29, the second constant voltage transfer electrode VV2' may include a stepwise portion in an area adjacent to the round-type edge RE. Accordingly, an end of the second constant voltage transfer electrode VV2' may be spaced apart from a center portion of the second constant voltage transfer electrode VV2' in the second direction DR2 or closer to the display area DA than the center portion of the second constant voltage transfer electrode VV2' is.

The first constant voltage transfer electrode VV1' may be disposed to closer to the display area DA than the second constant voltage transfer electrode VV2' is. A constant voltage bridge electrode VCL may electrically connect the first constant voltage transfer electrode VV1' and the second constant voltage transfer electrode VV2' to each other. Accordingly, the first constant voltage transfer electrode VV1' may receive the constant voltage signal from the second constant voltage transfer electrode VV2'.

In an embodiment, as shown in FIG. 29, the first constant voltage transfer electrode VV1' may include a stepwise portion in an area adjacent to the round-type edge RE. Accordingly, an end of the first constant voltage transfer electrode VV1' may be spaced apart from a center portion of the first constant voltage transfer electrode VV1' in the second direction DR2.

The first constant voltage transfer electrode VV1' may provide the constant voltage signal to the pixel PX disposed in the display area DA through a first constant voltage transfer line VL1 and a second constant voltage transfer line VL2.

In an embodiment, a horizontal transfer line VL_H may be further disposed in the display area DA. The horizontal transfer line VL_H may be a line electrically connected to each of the first constant voltage transfer line VL1 and the second constant voltage transfer line VL2.

Figure 30:
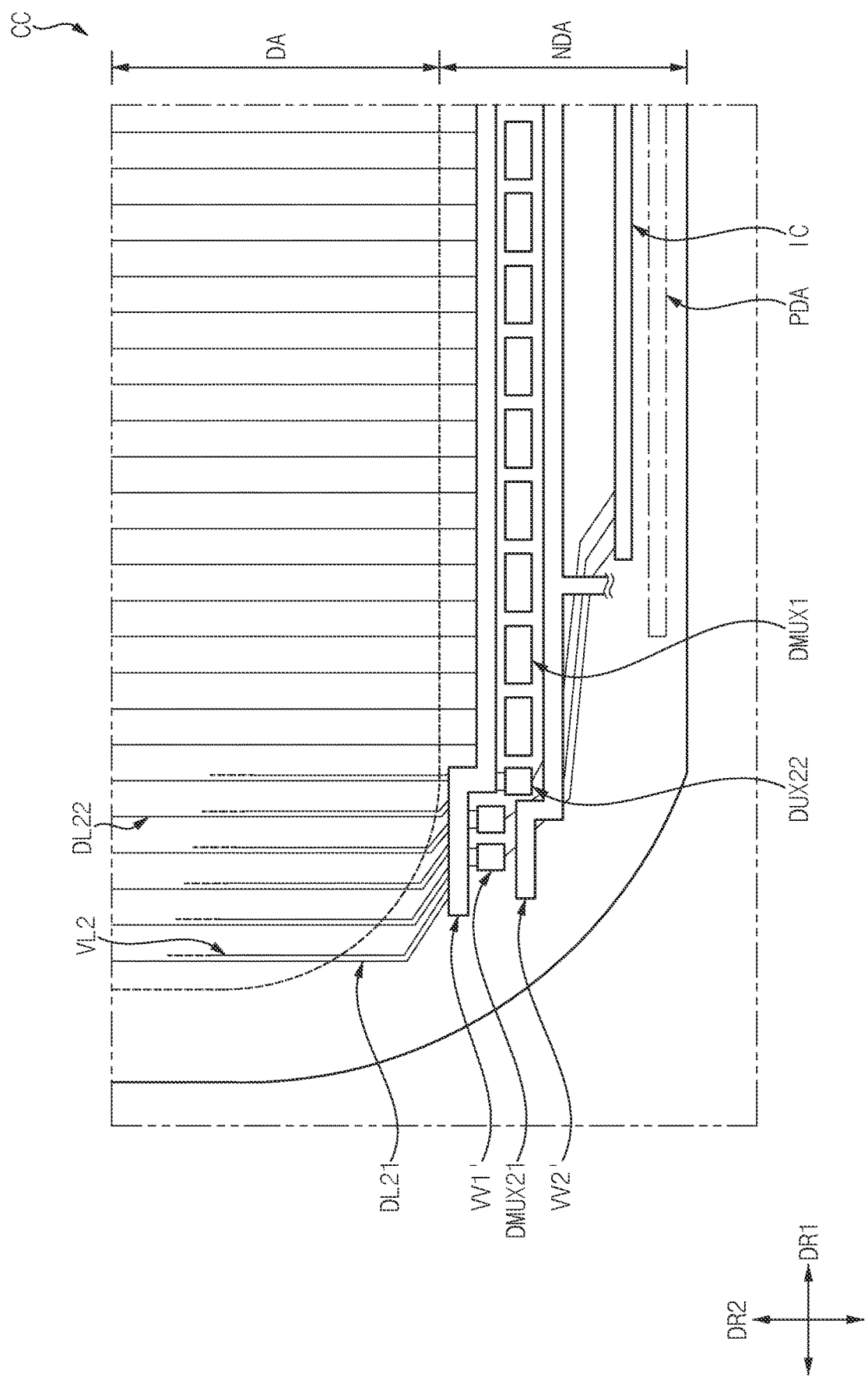

Referring to FIG. 27 and FIG. 30, the various components (refer to FIG. 28) for providing the data signal to the pixel PX disposed in the display area DA and the various components (refer to FIG. 29) for providing the constant voltage signal to the pixel PX disposed in the display area DA may be disposed in the peripheral area NDA at the same time.

In FIG. 30, for convenience of illustration and description, the first data line DL1 described with reference to FIG. 28 is not shown, and the first constant voltage transfer line VL1, the horizontal transfer line VL_H, and the constant voltage bridge electrode VCL described with reference to FIG. 29 are not shown.

In an embodiment, the first demultiplexer unit DMUX1, the second demultiplexer unit DMUX21, and the third demultiplexer unit DMUX22 may be disposed between the first constant voltage transfer electrode VV1' and the second constant voltage transfer electrode VV2'. In such an embodiment, the second demultiplexer unit DMUX21 may be disposed between the stepwise portion of the first constant voltage transfer electrode VV1' and the stepwise portion of the second constant voltage transfer electrode VV2'.

In such an embodiment, as each of the first constant voltage transfer electrode VV1' and the second constant voltage transfer electrode VV2' includes the stepwise portion, an area in which the first constant voltage transfer electrode VV1', the second constant voltage transfer electrode VV2', and the second demultiplexer unit DMUX21 are disposed in the peripheral area NDA adjacent to the round-type edge RE may be reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising:
   a plurality of pixels disposed in a display area, wherein the display area includes a round-type edge and a flat-type edge extending from the round-type edge;
   a first constant voltage transfer electrode linearly extending in a first direction and disposed in a peripheral area adjacent to the display area;
   a first constant voltage transfer line electrically connected to the first constant voltage transfer electrode in the peripheral area, wherein the first constant voltage transfer line extends from a straight portion of the first constant voltage transfer electrode to the display area via the flat-type edge; and
   a second constant voltage transfer line electrically connected to the first constant voltage transfer electrode in the peripheral area, wherein the second constant voltage transfer line extends from the straight portion of the first constant voltage transfer electrode to the display area via the round-type edge.

2. The display panel of claim 1, further comprising:
   a horizontal transfer line electrically connected to each of the first constant voltage transfer line and the second constant voltage transfer line in the display area.

3. The display panel of claim 2, wherein
   each of the first constant voltage transfer line, the second constant voltage transfer line, and the horizontal transfer line is provided in plural, and
   a plurality of horizontal transfer lines cross a plurality of first constant voltage transfer lines and a plurality of second constant voltage transfer lines to form a mesh shape in a plan view.

4. The display panel of claim 1, wherein
   each of the first constant voltage transfer line and the second constant voltage transfer line is integrally formed with the first constant voltage transfer electrode as a single unitary and indivisible part, and
   the first constant voltage transfer line and the second constant voltage transfer line are defined as lines branching from and extending from the first constant voltage transfer electrode.

5. The display panel of claim 1, wherein each of the first constant voltage transfer line and the second constant voltage transfer line extends in a second direction crossing the first direction in the display area.

6. The display panel of claim 1, wherein the second constant voltage transfer line comprises:
   a first portion electrically connected to the first constant voltage transfer electrode in the peripheral area, and extending in a second direction crossing the first direction;
   a second portion extending from the first portion in a direction crossing each of the first direction and second direction; and
   a third portion extending from the second portion to the display area via the round-type edge.

7. The display panel of claim 6, wherein the first constant voltage transfer line extends in the second direction in the peripheral area.

8. The display panel of claim 1, further comprising:
   a demuxing unit disposed in the peripheral area and which demuxes a data signal, wherein the demuxing unit comprises a first demultiplexer unit and a second demultiplexer unit disposed adjacent to the first demultiplexer unit;
   a first data line electrically connected to the first demultiplexer unit in the peripheral area, and extending to the display area via the flat-type edge; and
   a second data line electrically connected to the second demultiplexer unit in the peripheral area, and extending to the display area via the round-type edge.

9. The display panel of claim 8, wherein the first data line comprises:
   a first bridge line electrically connected to the first demultiplexer unit, and overlapping the first constant voltage transfer electrode in a plan view, wherein the first bridge line is disposed in a different layer from a layer in which the first constant voltage transfer electrode is disposed; and
   a first data transfer line electrically connected to the first bridge line, and extending to the display area via the flat-type edge.

10. The display panel of claim 9, wherein the second data line comprises:
    a second bridge line electrically connected to the second demultiplexer unit, and overlapping the first constant voltage transfer electrode in the plan view, wherein the second bridge line is disposed in a different layer from the layer in which the first constant voltage transfer electrode is disposed; and
    a second data transfer line electrically connected to the second bridge line, and extending to the display area via the round-type edge.

11. The display panel of claim 10, wherein the first data transfer line, the second data transfer line, the first constant voltage transfer line, and the second constant voltage transfer line are disposed in a same layer as each other.

12. The display panel of claim 8, wherein
    each of the second data line and the second constant voltage transfer line is provided in plural, wherein,
    a number of a plurality of second data lines is the same as a number of a plurality of second constant voltage transfer lines.

13. The display panel of claim 12, wherein the second data lines and the second constant voltage transfer lines are alternately arranged in the peripheral area.

14. The display panel of claim 8, wherein a planar area of the first demultiplexer unit is greater than a planar area of the second demultiplexer unit.

15. The display panel of claim 14, wherein a width of the first demultiplexer unit in the first direction is greater than a width of the second demultiplexer unit in the first direction.

16. The display panel of claim 8, further comprising:
    a second constant voltage transfer electrode disposed to space apart from the first constant voltage transfer electrode in a second direction crossing the first direction, and electrically connected to a pad electrode unit, wherein the first demultiplexer unit and the second demultiplexer unit are disposed between the first constant voltage transfer electrode and the second constant voltage transfer electrode; and
    a constant voltage bridge electrode electrically connecting the first constant voltage transfer electrode and the second constant voltage transfer electrode to each other.

17. The display panel of claim 16, wherein
each of the first demultiplexer unit and the constant voltage bridge electrode is provided in plural, and
one of a plurality of constant voltage bridge electrodes is disposed between two adjacent first demultiplexer units among a plurality of first demultiplexer units in a plan view.

18. The display panel of claim 16, further comprising:
A cover bridge electrode electrically connecting the first constant voltage transfer electrode and the second constant voltage transfer electrode to each other, and overlapping at least a portion of the second demultiplexer unit in a plan view.

19. The display panel of claim 18, wherein the cover bridge electrode is electrically insulated from the second demultiplexer unit.

* * * * *